United States Patent
Gibb et al.

(10) Patent No.: US 10,855,250 B2
(45) Date of Patent: *Dec. 1, 2020

(54) COMMUNICATION FILTER FOR LTE BAND 41

(71) Applicant: Akoustis, Inc., Huntersville, NC (US)

(72) Inventors: Shawn R. Gibb, Huntersville, NC (US); Ramakrishna Vetury, Charlotte, NC (US); Jeffrey B. Shealy, Cornelius, NC (US); Mark D. Boomgarden, Huntersville, NC (US); Michael P. Lewis, Charlotte, NC (US); Alexander Y. Feldman, Huntersville, NC (US)

(73) Assignee: AKOUSTIS, INC., Huntersville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/282,238

(22) Filed: Feb. 21, 2019

(65) Prior Publication Data

US 2019/0181831 A1    Jun. 13, 2019

Related U.S. Application Data

(63) Continuation-in-part of application No. 15/647,098, filed on Jul. 11, 2017, now Pat. No. 10,256,786.

(Continued)

(51) Int. Cl.
    *H03H 9/17*     (2006.01)
    *H03H 9/56*     (2006.01)
(Continued)

(52) U.S. Cl.
    CPC ............. *H03H 9/172* (2013.01); *H03H 3/02* (2013.01); *H03H 9/0523* (2013.01);
(Continued)

(58) Field of Classification Search
CPC ............... H03H 9/02; H03H 9/17; H03H 9/56
See application file for complete search history.

(56) References Cited

U.S. PATENT DOCUMENTS 7,696,004 B2 * 4/2010 Yuan ..................... H01L 23/10
                                                      438/106
9,123,885 B2 * 9/2015 Iwamoto ............. H01L 41/0815
(Continued)

*Primary Examiner* — Dean O Takaoka
*Assistant Examiner* — Alan Wong
(74) *Attorney, Agent, or Firm* — Richard T. Ogawa; Ogawa P.C.

(57) ABSTRACT

A communication system using a single crystal acoustic resonator device. The device includes a piezoelectric substrate with a piezoelectric layer formed overlying a transfer substrate. A topside metal electrode is formed overlying the substrate. A topside micro-trench is formed within the piezoelectric layer. A topside metal with a topside metal plug is formed within the topside micro-trench. First and second backside cavities are formed within the transfer substrate under the topside metal electrode. A backside metal electrode is formed under the transfer substrate, within the first backside cavity, and under the topside metal electrode. A backside metal plug is formed under the transfer substrate, within the second backside cavity, and under the topside micro-trench. The backside metal plug is connected to the topside metal plug and the backside metal electrode. The topside micro-trench, the topside metal plug, the second backside cavity, and the backside metal plug form a microvia.

24 Claims, 18 Drawing Sheets

Related U.S. Application Data

(60) Provisional application No. 62/360,904, filed on Jul. 11, 2016.

(51) Int. Cl.
    *H03H 9/05*       (2006.01)
    *H03H 9/10*       (2006.01)
    *H03H 9/70*       (2006.01)
    *H03H 3/02*       (2006.01)

(52) U.S. Cl.
    CPC .......... *H03H 9/1007* (2013.01); *H03H 9/174* (2013.01); *H03H 9/564* (2013.01); *H03H 9/566* (2013.01); *H03H 9/706* (2013.01); *H03H 2003/023* (2013.01)

(56) References Cited

U.S. PATENT DOCUMENTS

| | | | |
|---|---|---|---|
| 9,893,270 B2* | 2/2018 | Araki | H01L 41/314 |
| 10,110,188 B2* | 10/2018 | Vetury | H03H 3/04 |
| 10,110,190 B2* | 10/2018 | Vetury | H03H 3/04 |
| 10,217,930 B1* | 2/2019 | Feldman | H01L 41/29 |
| 10,256,786 B1* | 4/2019 | Gibb | H03H 9/0514 |
| 10,630,259 B2* | 4/2020 | Hurwitz | H03H 3/02 |
| 2005/0140247 A1* | 6/2005 | Lee | H03H 9/173 |
| | | | 310/320 |
| 2010/0088868 A1* | 4/2010 | Kando | H01L 41/187 |
| | | | 29/25.35 |
| 2019/0148621 A1* | 5/2019 | Feldman | H01L 41/29 |
| | | | 29/25.35 |
| 2019/0190479 A1* | 6/2019 | Vetury | H03H 3/04 |

* cited by examiner

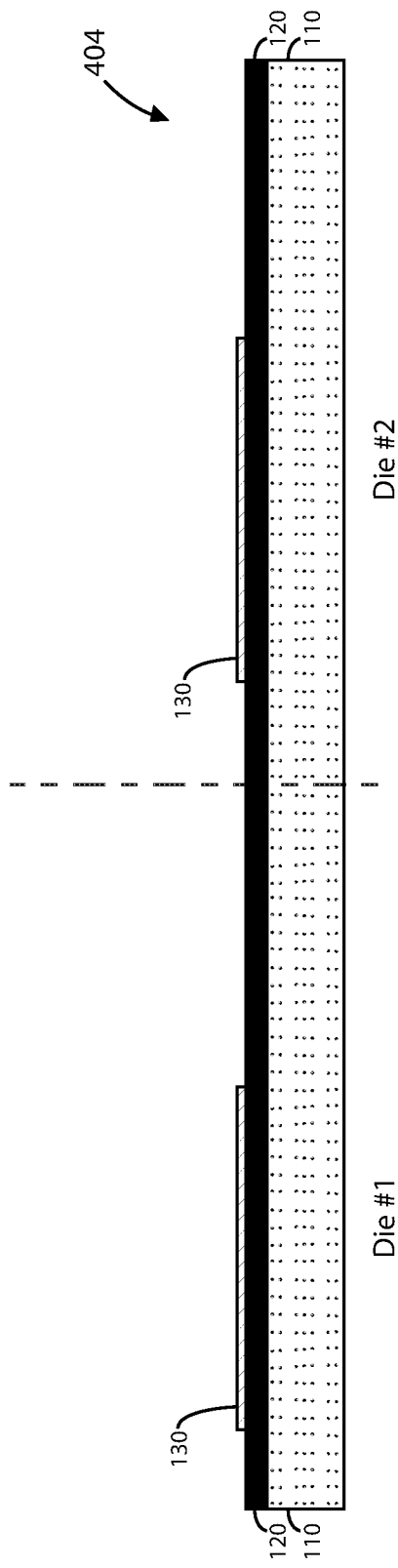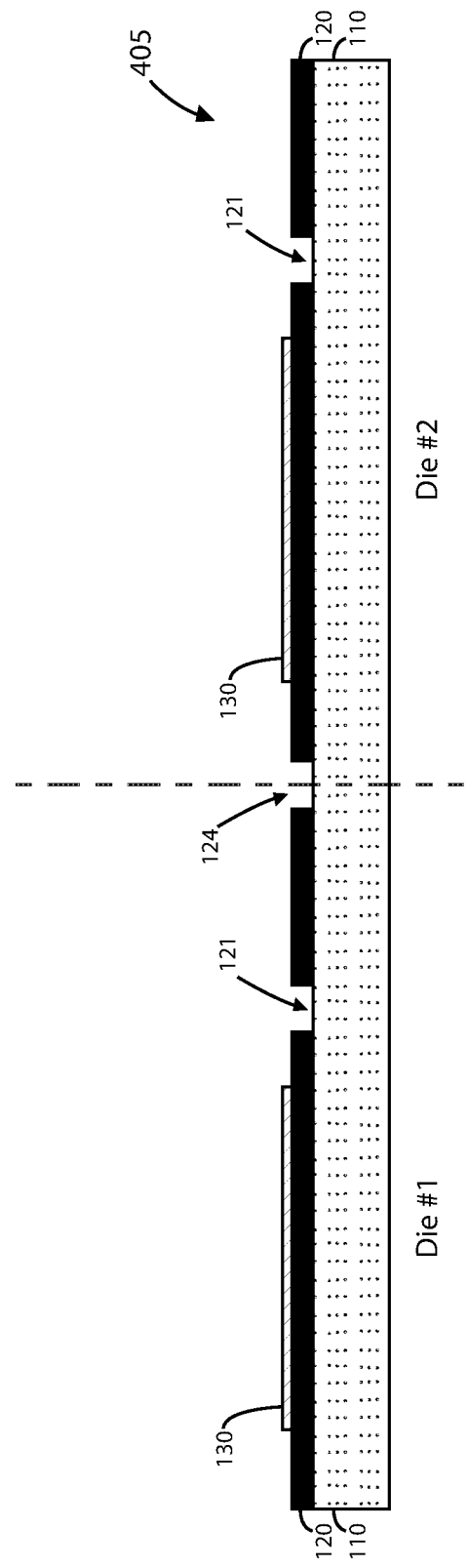

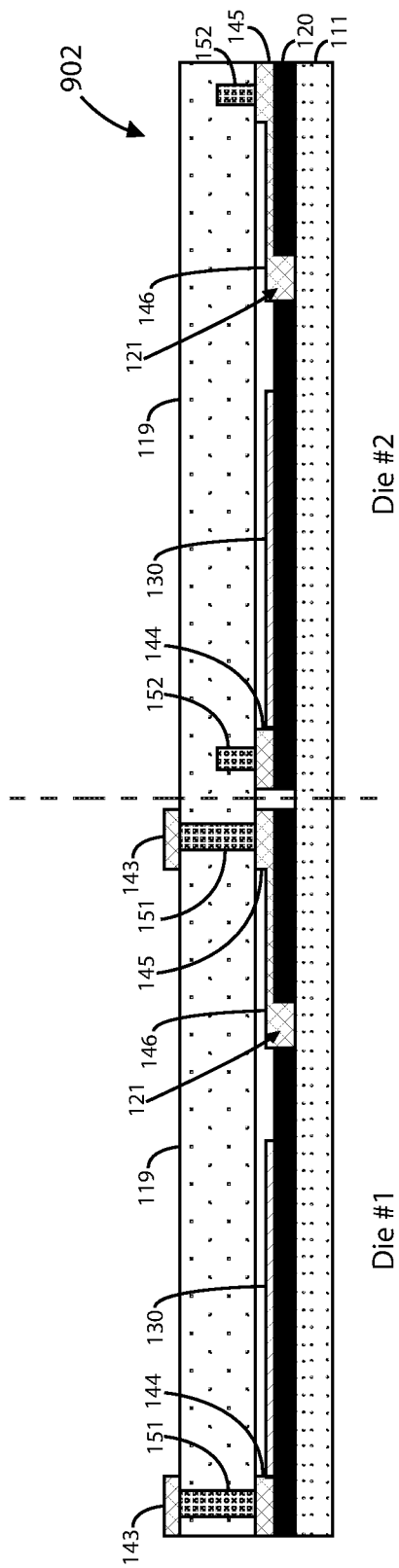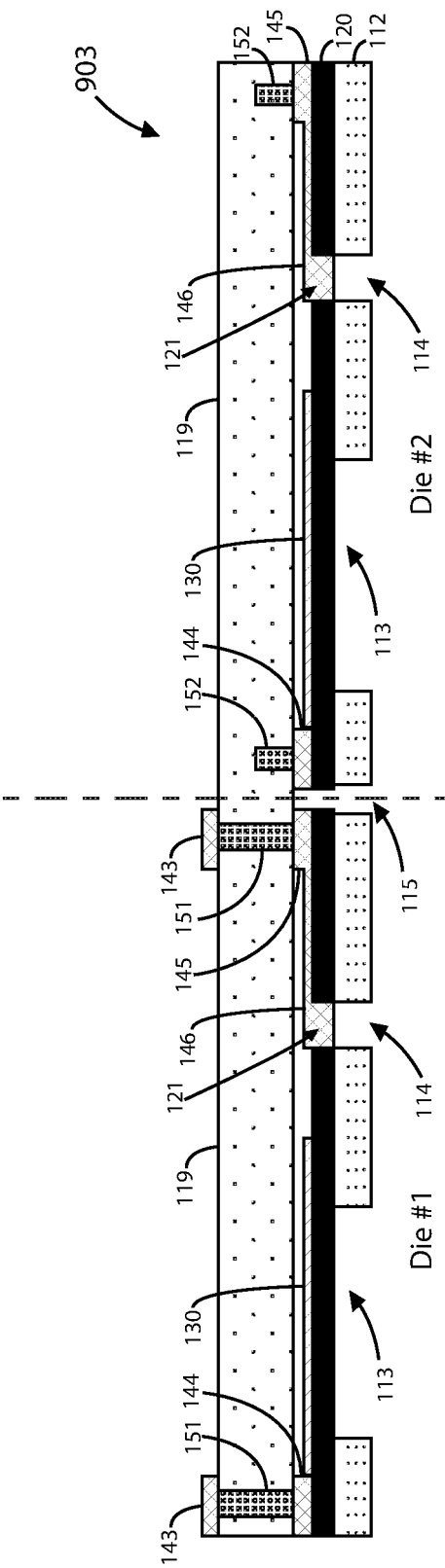

COMMUNICATION FILTER FOR LTE BAND 41

CROSS-REFERENCES TO RELATED APPLICATIONS

The present application is a continuation-in-part application of U.S. patent application Ser. No. 15/647,098, filed Jul. 11, 2017, which claims priority to U.S. Pat. App. No. 62/360,904, filed Jul. 11, 2016.

BACKGROUND OF THE INVENTION

The present invention relates generally to electronic devices. More particularly, the present invention provides techniques related to bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

From the above, it is seen that techniques for improving electronic devices are highly desirable.

BRIEF SUMMARY OF THE INVENTION

The present invention relates generally to electronic devices. More particularly, the present invention provides techniques related to bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

In an example, the present invention provides a communication system using a single crystal acoustic resonator device. The device includes a piezoelectric substrate with a piezoelectric layer formed overlying a transfer substrate. In a specific example, the piezoelectric layer is bonded to the transfer substrate using one or more dielectric layers containing silicon nitride, silicon oxide, or other adhesion materials. A topside metal electrode is formed overlying the substrate. A topside micro-trench is formed within the piezoelectric layer. A topside metal with a topside metal plug is formed within the topside micro-trench. First and second backside cavities are formed within the transfer substrate under the topside metal electrode. A backside metal electrode is formed under the transfer substrate, within the first backside trench, and under the topside metal electrode. A backside metal plug is formed under the transfer substrate, within the second backside trench, and under the topside micro-trench. The backside metal plug is connected to the topside metal plug and the backside metal electrode. The topside micro-trench, the topside metal plug, the second backside trench, and the backside metal plug form a micro-via.

In a specific example, the communication filter can be a bandpass RF filter characterized by the following: 50Ω input/output, no external matching requirement, low insertion loss, high interference rejection, −20° C. to +85° C. operation, +31 dBm absolute max input power, 2.0×1.6 mm footprint, 0.90 mm max height, RoHS 6 compliant, halogen free, and Tetrabromobisphenal A (TBBPA) free. This filter can be used in smartphones, tablets, Internet of things (IoT), and other mobile or portable communication devices. Those of ordinary skill in the art will recognize other variations, modifications, and alternatives.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic filter or resonator using multiple ways of three-dimensional stacking through a wafer level process. Such single crystal acoustic resonators enable high bandwidth-low loss filters in a miniature form factor, and such filters or resonators can be implemented in an RF filter device, an RF filter system, or the like. In an example, this communication filter can be a miniature filter configured for use in a 2496-2690 MHz wireless frequency spectrum. This filter can operate concurrently with adjacent 2.4 GHz bands including Wi-Fi, WLAN, Bluetooth, ISM, and the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 9B and 9C are simplified diagrams illustrating an alternative method for conducting the method step of forming backside cavities, as described in FIG. 9A, and simultaneously singulating a transfer substrate according to an example of the present invention.

DETAILED DESCRIPTION OF THE INVENTION

The present invention relates generally to electronic devices. More particularly, the present invention provides techniques related to bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Figure 1A:
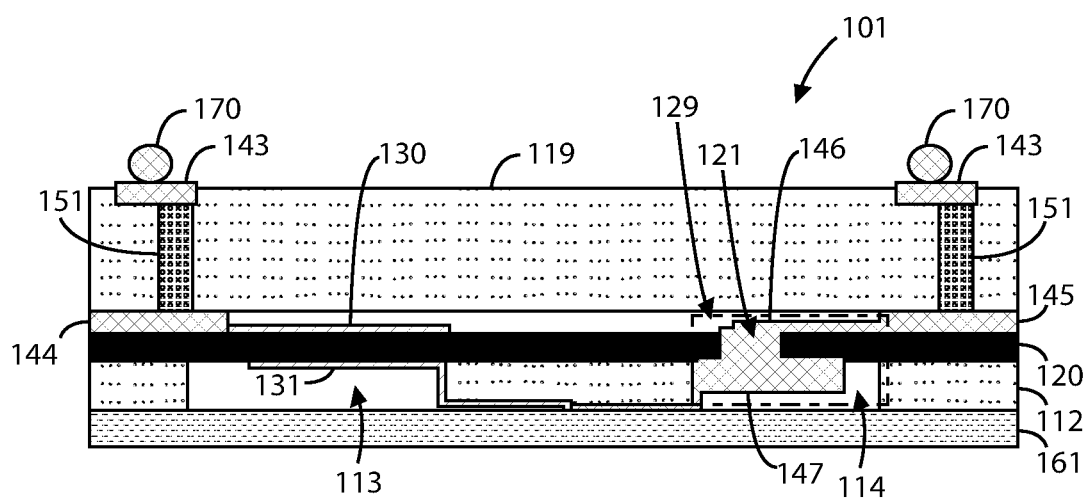
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a transfer substrate 112 with an overlying single crystal piezoelectric layer 120, which has a micro-via 129. In a specific example, the piezoelectric layer is bonded to the transfer substrate using one or more dielectric layers containing silicon nitride, silicon oxide, or other adhesion materials. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside cavities 113, 114. A backside metal electrode 131 is formed underlying a portion of the transfer substrate 112, the first backside trench 113, and the topside metal electrode 130. The backside metal plug 147 is formed underlying a portion of the transfer substrate 112, the second backside trench 114, and the topside metal 145. This backside metal plug 147 is electrically coupled to the topside metal plug 146 and the backside metal electrode 131. A backside cap structure 161 is bonded to the transfer substrate 112, underlying the first and second backside cavities 113, 114. Further details relating to the method of manufacture of this device will be discussed starting from FIG. 2.

Figure 1B:
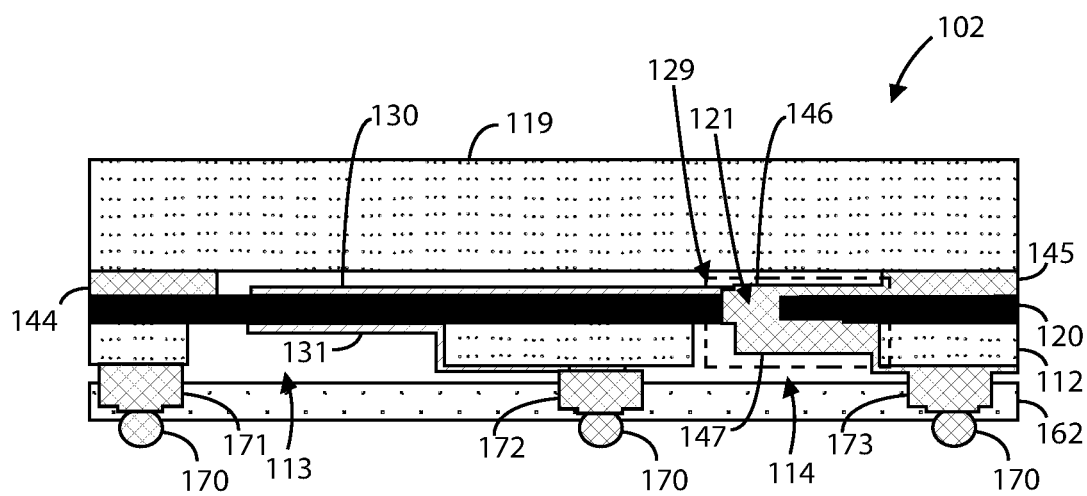
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a transfer substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside cavities 113, 114. A backside metal electrode 131 is formed underlying a portion of the transfer substrate 112, the first backside trench 113, and the topside metal electrode 130. A backside metal plug 147 is formed underlying a portion of the transfer substrate 112, the second backside trench 114, and the topside metal plug 146. This backside metal plug 147 is electrically coupled to the topside metal plug 146. A backside cap structure 162 is bonded to the transfer substrate 112, underlying the first and second backside cavities. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
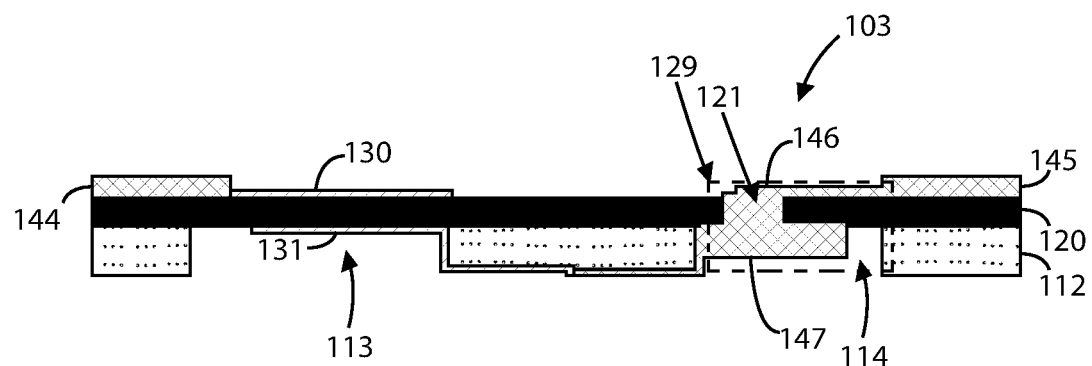
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a transfer substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside cavities 113, 114. A backside metal electrode 131 is formed underlying a portion of the transfer substrate 112, the first backside trench 113, and the topside metal electrode 130. A backside metal plug 147 is formed underlying a portion of the transfer substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
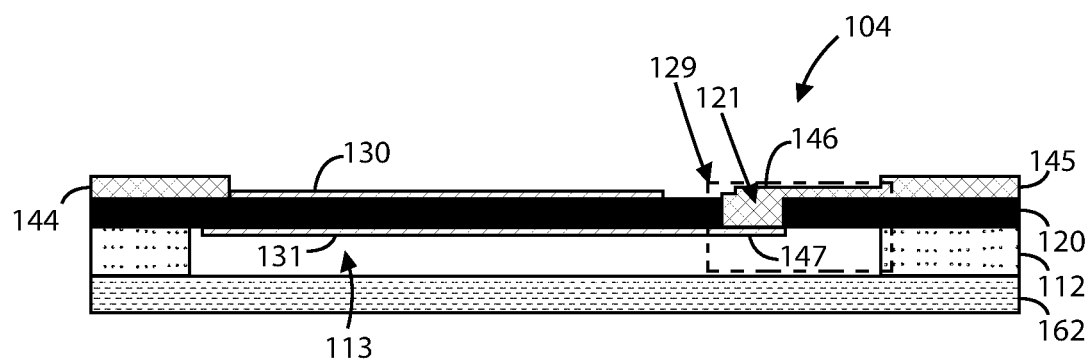
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a transfer substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the transfer substrate 112, the first backside trench 113, and the topside metal electrode 130. A backside metal 147 is formed underlying a portion of the transfer substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
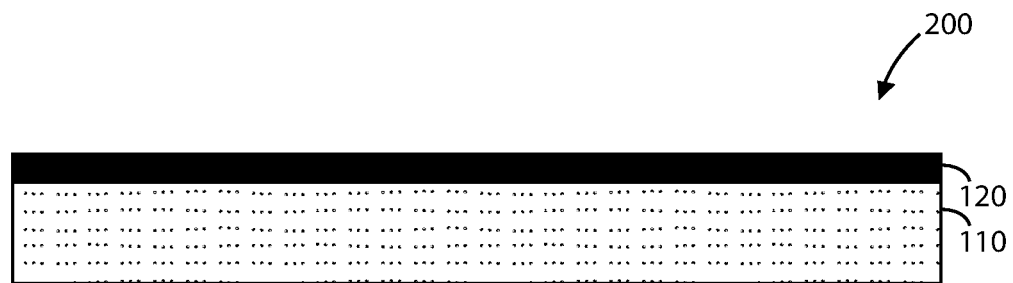
FIGS. 2 and 3 are simplified diagrams illustrating steps for a method of manufacture for an acoustic resonator device according to an example of the present invention.
Figure 3:
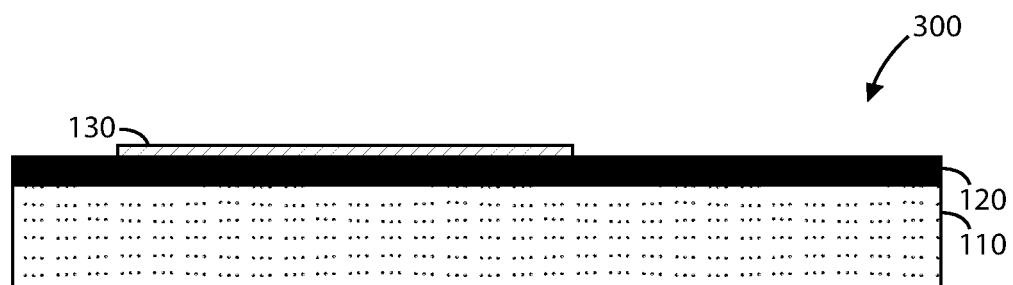

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a transfer substrate 110 with a piezoelectric layer 120 formed overlying. In a specific example, the transfer substrate can include silicon, silicon carbide, aluminum oxide, silicon-on-insulation (SOI), or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

In an example, the method can further include forming a dielectric layer overlying the top metal electrode 130 and the piezoelectric layer 120. This layer can include Silicon Nitride (SiN), Silicon Dioxide (SiO$_2$), or the like. In a specific example, the dielectric layer may include a stack of SiN and SiO$_2$ layers or a combination of other types of dielectric layers. Prior to the steps of FIGS. 5-8, "vias" may be opened up to provide a path for other interconnect metals or electrodes to connect to the top metal electrode 130. This process may also be applied to other interconnect metals and electrodes implemented on the bottom side of the acoustic resonator device as well.

Figure 4A:
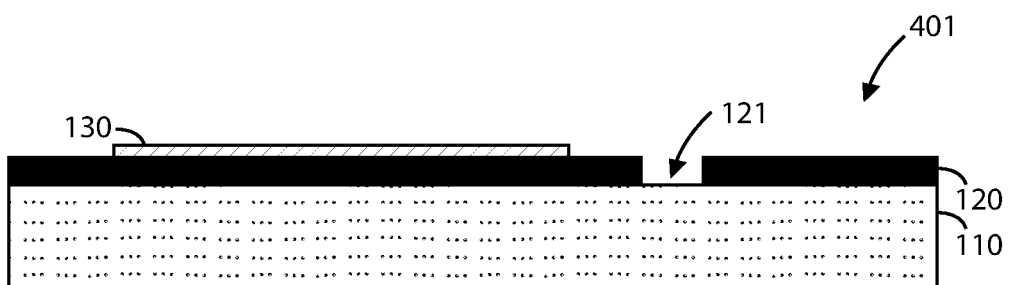
FIG. 4A is a simplified diagram illustrating a step for a method creating a topside micro-trench according to an example of the present invention.
Figure 4B:
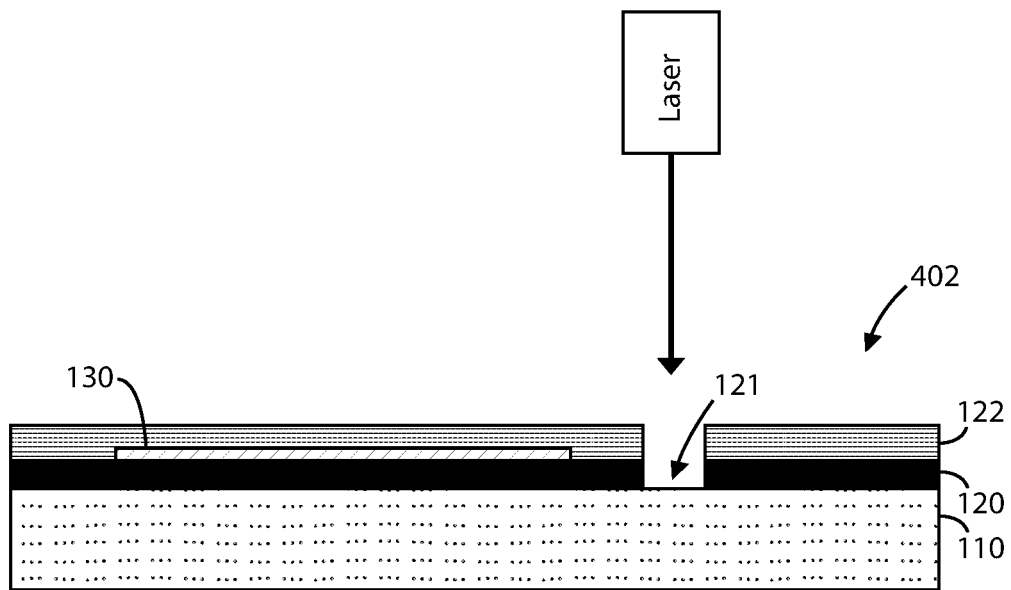
FIGS. 4B and 4C are simplified diagrams illustrating alternative methods for conducting the method step of forming a topside micro-trench as described in FIG. 4A.
Figure 4C:
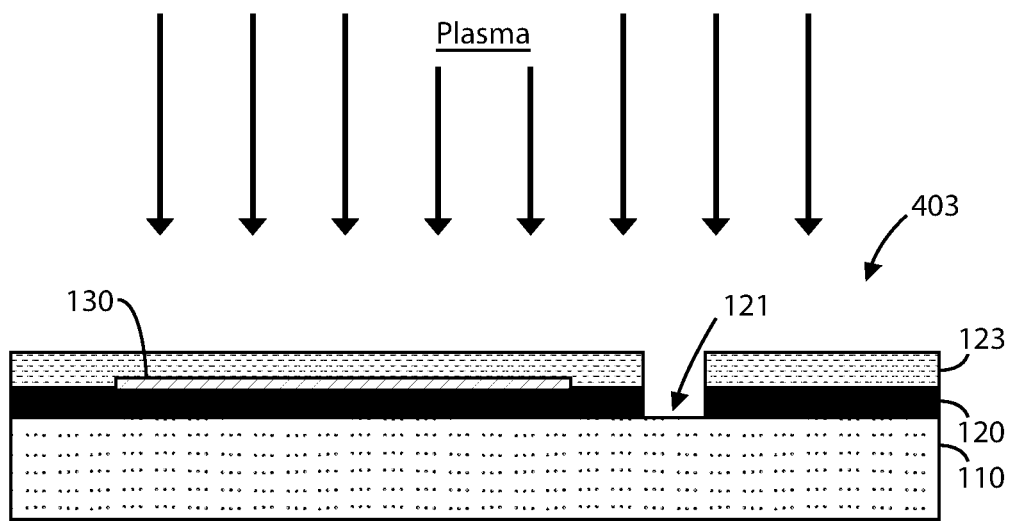

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the transfer substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the transfer substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
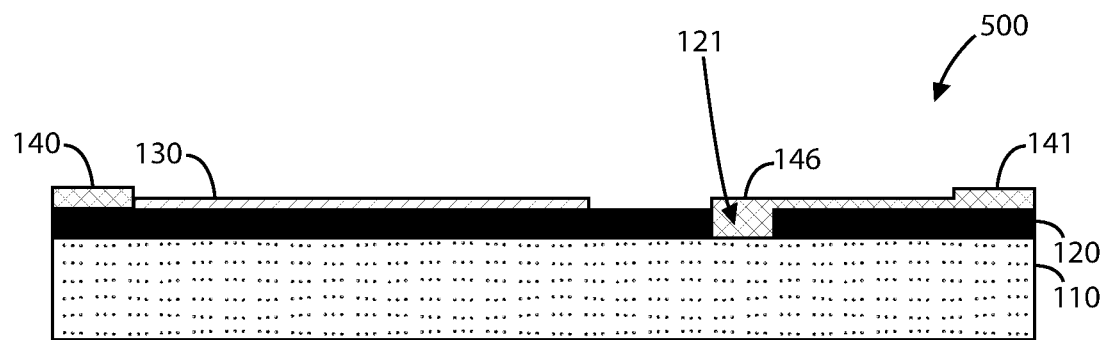
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold, aluminum, copper, or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

In an example, the method can further include forming a dielectric layer overlying the top metal electrode 130, the bond pad 140, the topside metal 141, the topside metal plug 146, and the piezoelectric layer 120. This layer may service as a passivation/protection layer and can include Silicon Nitride (SiN), Silicon Dioxide ($SiO_2$), or the like. In a specific example, the dielectric layer may include a stack of SiN and $SiO_2$ layers or a combination of other types of dielectric layers. Similar to before, "vias" may be opened up to provide a path for other interconnect metals or electrodes to connect to any of the above-mentioned interconnect metals, electrodes, or bond pads. This process may also be applied to other interconnect metals, electrodes, and bond pads on the bottom side of the acoustic resonator device as well.

Figure 6:
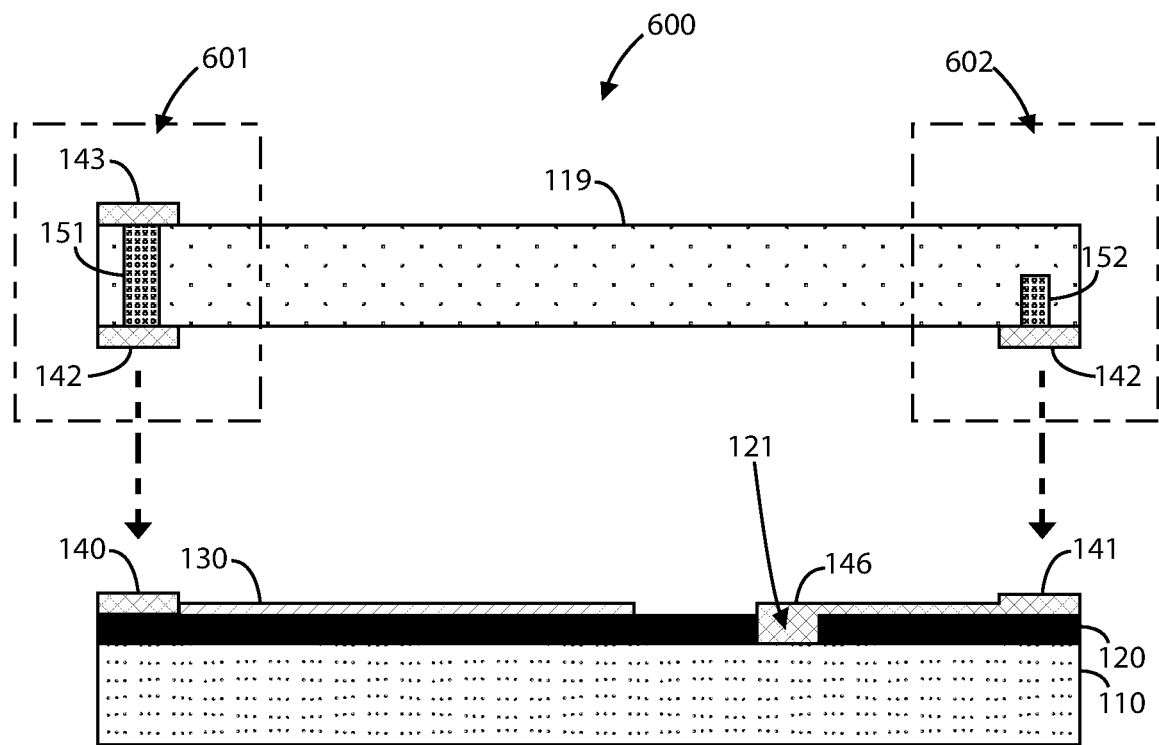

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142.

According to various examples, the top cap structure can include a silicon substrate, a sapphire ($Al_2O_3$) substrate, glass, smart-glass, a metallized laminate substrate, or other like material. An example with a top cap structure using an interposer substrate can include a glass material with one or more thru metal via structures. A silicon top cap structure can have one or more thru silicon via (TSV) structures. Further, a top cap structure can include a metallized laminate substrate with one or more thru substrate via structures. Those of ordinary skill in the art will recognize other variations, modifications, and alternatives.

Figure 7:
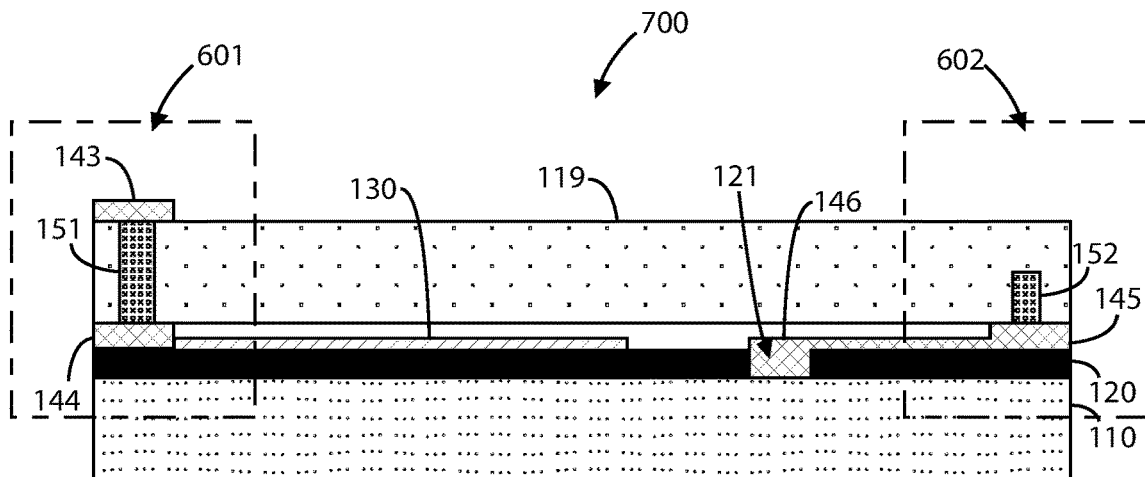
Figure 8:
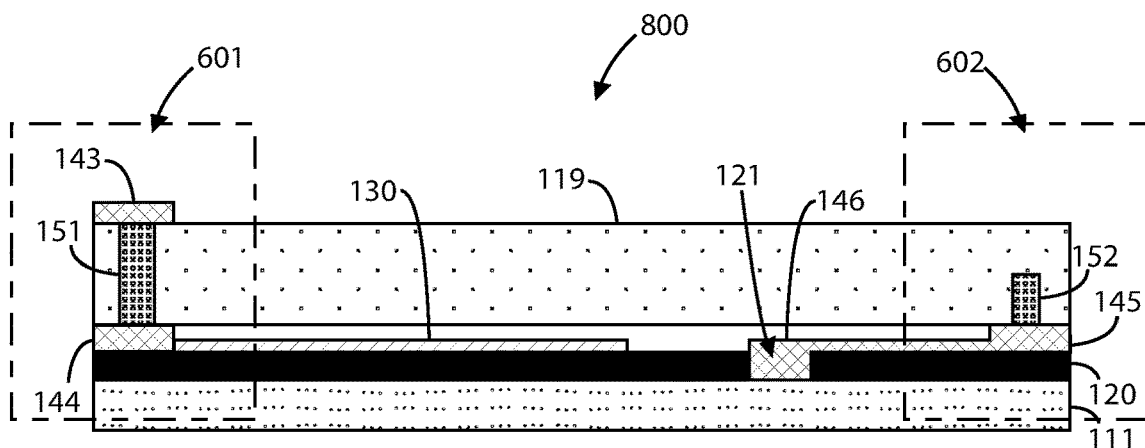

FIG. 7 can represent a method step of bonding the top cap structure to the partially processed acoustic resonator device. As shown, the substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the transfer substrate 110, which is now denoted as transfer substrate 111. This substrate thinning process can include grinding and etching processes or the like. In a specific example, this process can include a wafer backgrinding process followed by stress removal, which can involve dry etching, CMP polishing, or annealing processes.

Figure 9A:
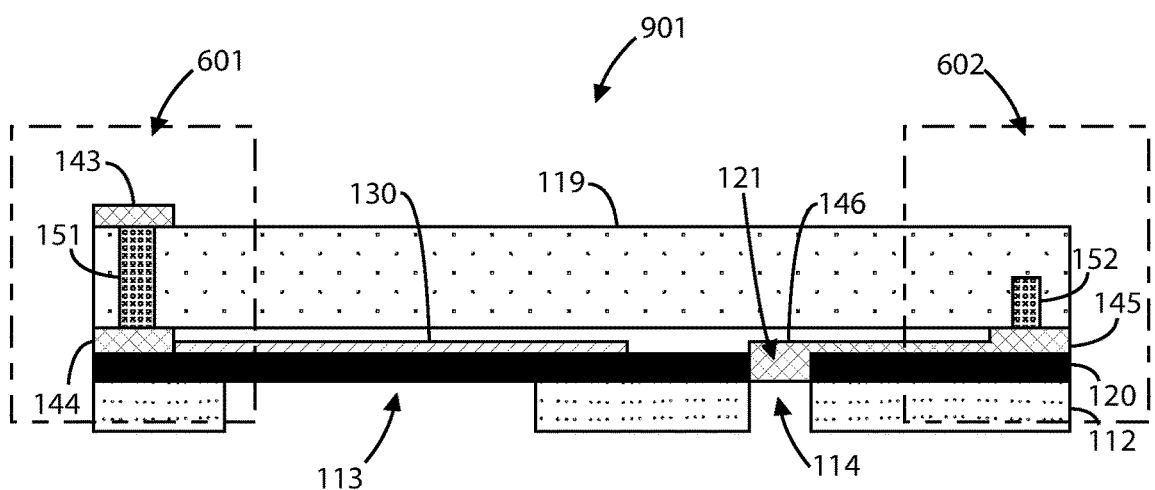
FIG. 9A is a simplified diagram illustrating a method step for forming backside cavities according to an example of the present invention.

FIG. 9A is a simplified diagram illustrating a step for a method of manufacture for an acoustic resonator device 901 according to an example of the present invention. FIG. 9A can represent a method step for forming backside cavities 113 and 114 to allow access to the piezoelectric layer from the backside of the transfer substrate 111. In an example, the first backside cavity 113 can be formed within the transfer substrate 111 and underlying the topside metal electrode 130. The second backside cavity 114 can be formed within the transfer substrate 111 and underlying the topside microtrench 121 and topside metal plug 146. This substrate is now denoted thinned substrate 112. In a specific example, these cavities 113 and 114 can be formed using deep reactive ion etching (DRIE) processes, Bosch processes, or the like. The size, shape, and number of the cavities may vary with the design of the acoustic resonator device. In various examples, the first backside cavity may be formed with a trench shape similar to a shape of the topside metal electrode or a shape of the backside metal electrode. The first backside cavity may also be formed with a trench shape that is different from both a shape of the topside metal electrode and the backside metal electrode.

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside cavities (113, 114) on each of these dies while also etching a scribe line 115 or dicing line. In an example, the etching of the scribe line 115 provides an optional way to singulate the backside wafer 112.

Figure 10:
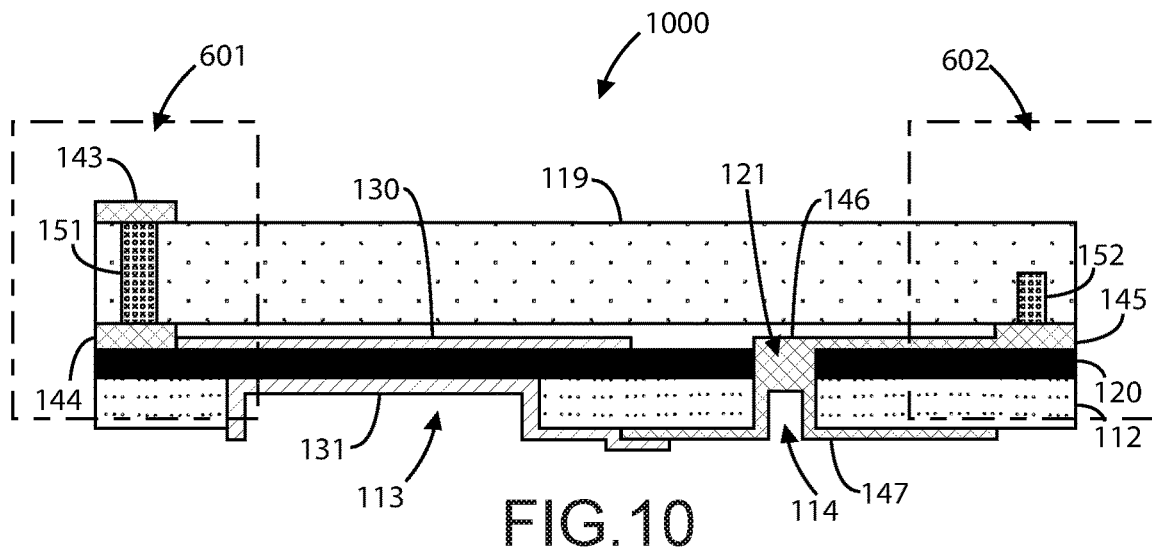
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside cavities of the transfer substrate 112. In an example, the backside metal electrode 131 can be formed underlying one or more portions of the thinned substrate 112, within the first backside cavity 113, and underlying the topside metal electrode 130. This process completes the resonator structure within the acoustic resonator device. The backside metal plug 147 can be formed underlying one or more portions of the thinned substrate 112, within the second backside cavity 114, and underlying the topside microtrench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
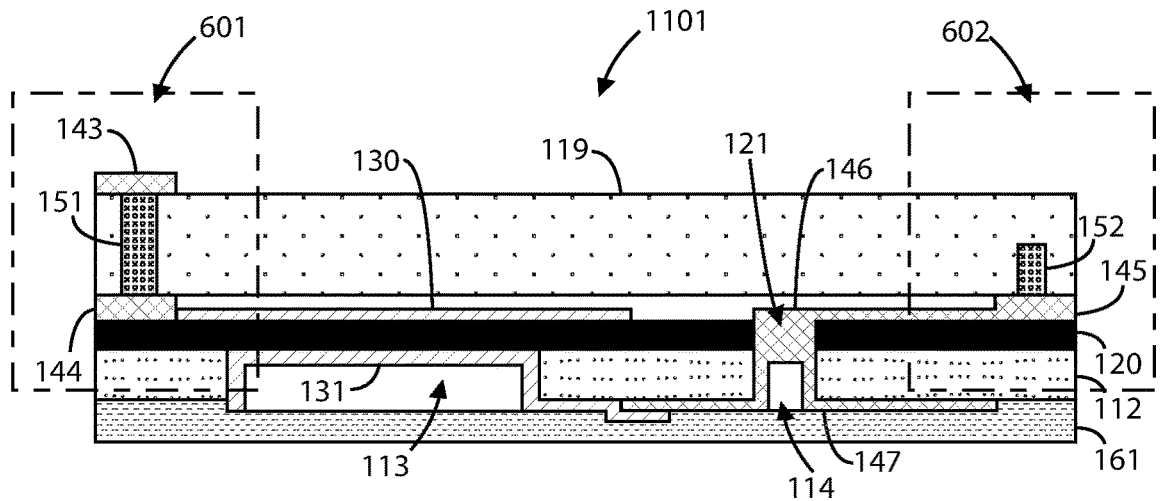
FIGS. 11A and 11B are simplified diagrams illustrating alternative steps for a method of manufacture for an acoustic resonator device according to an example of the present invention.
Figure 11B:
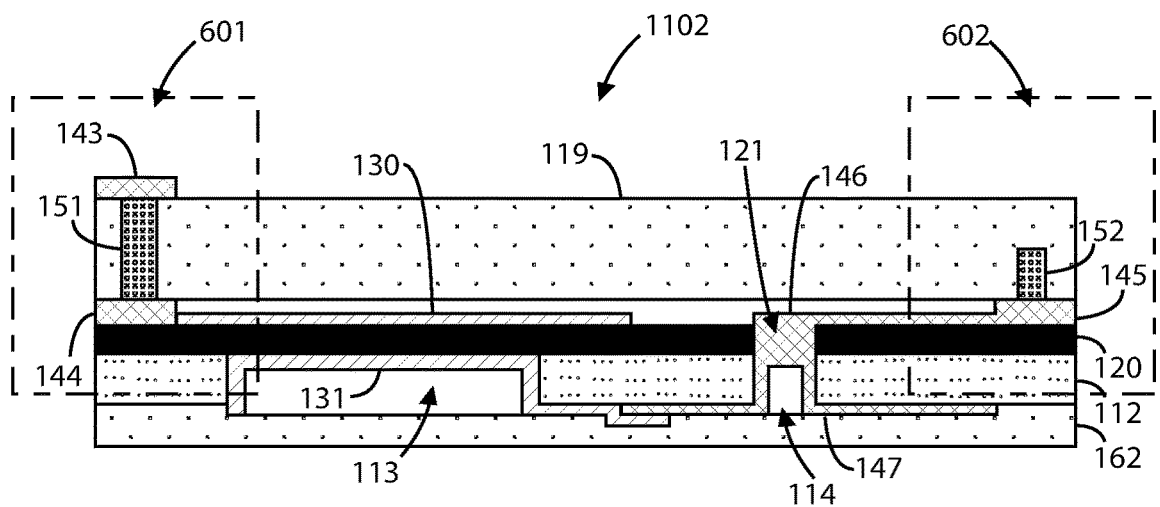

FIGS. 11A and 11B are simplified diagrams illustrating alternative steps for a method of manufacture for an acoustic resonator device according to an example of the present invention. These figures show methods of bonding a backside cap structure underlying the transfer substrate 112. In FIG. 11A, the backside cap structure is a dry film cap 161, which can include a permanent photo-imagable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
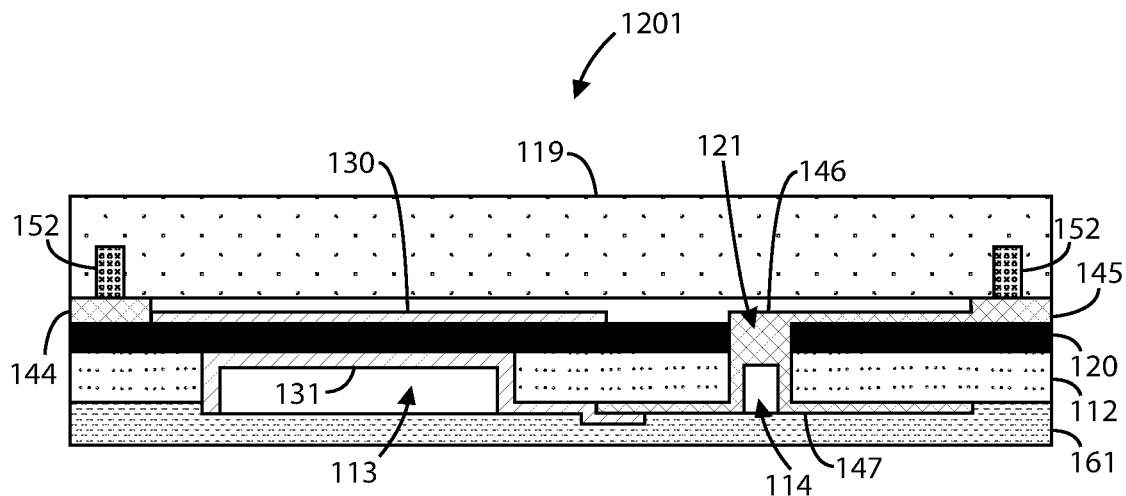
FIGS. 12A to 12E are simplified diagrams illustrating steps for a method of manufacture for an acoustic resonator device using a blind via structure according to an example of the present invention.
Figure 12B:
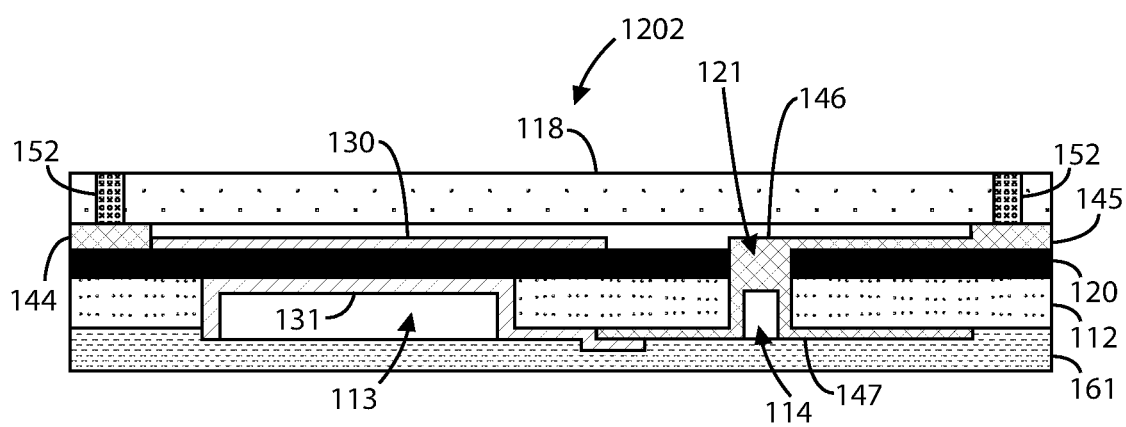
Figure 12C:
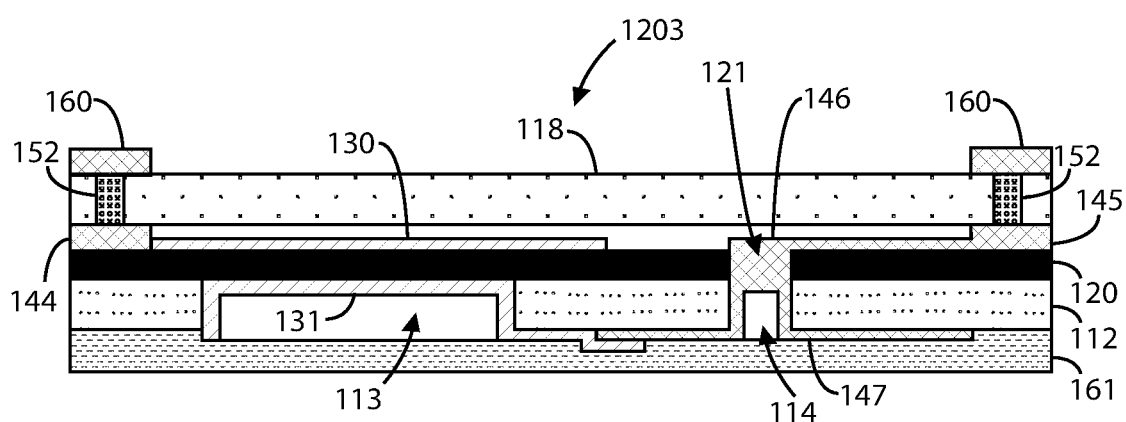
Figure 12D:
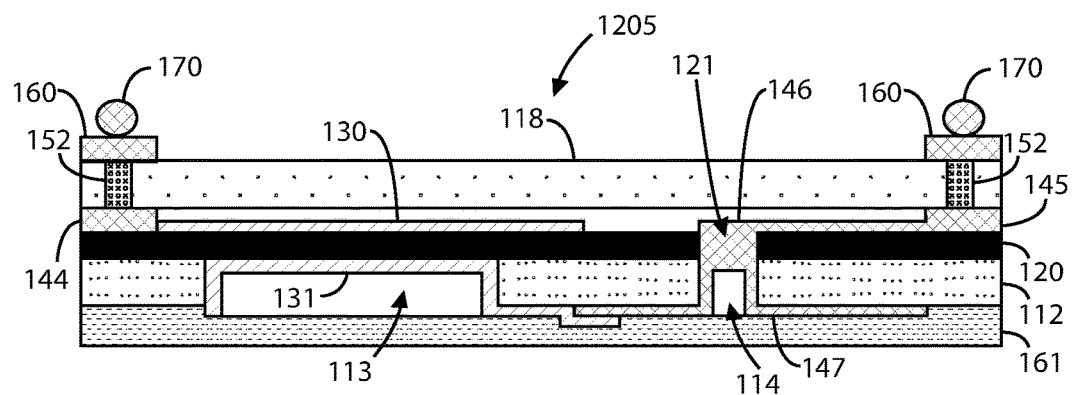
Figure 12E:
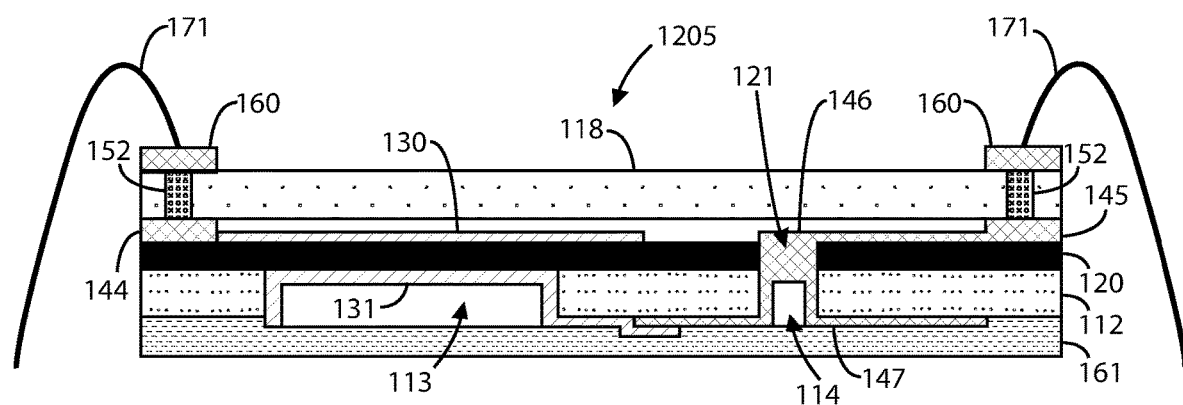

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure or other similar top cap structure versions, such as a silicon top cap, a metallized laminate top cap, and others. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the transfer substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
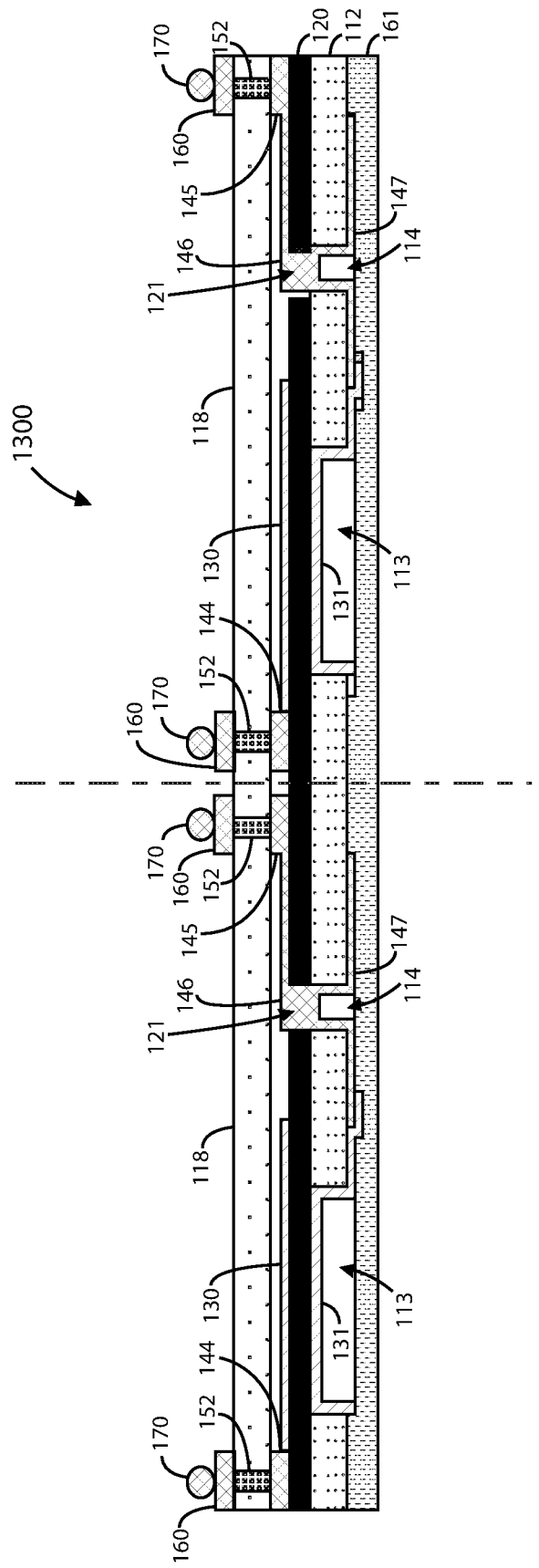
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
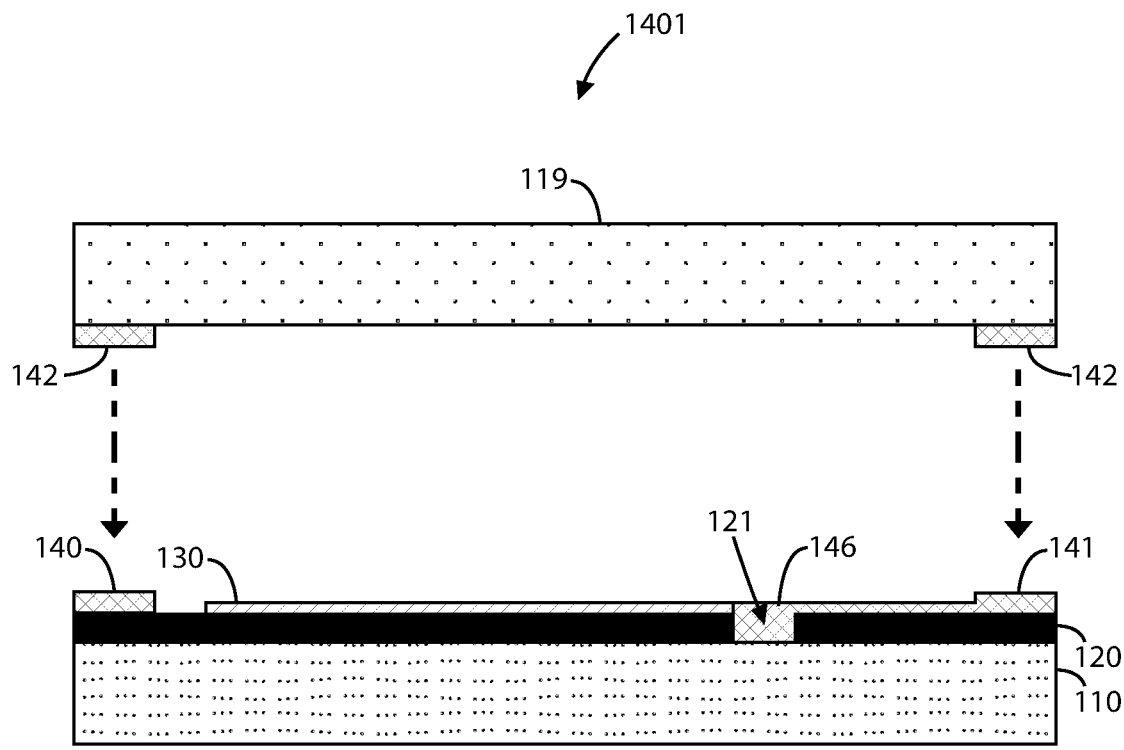
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
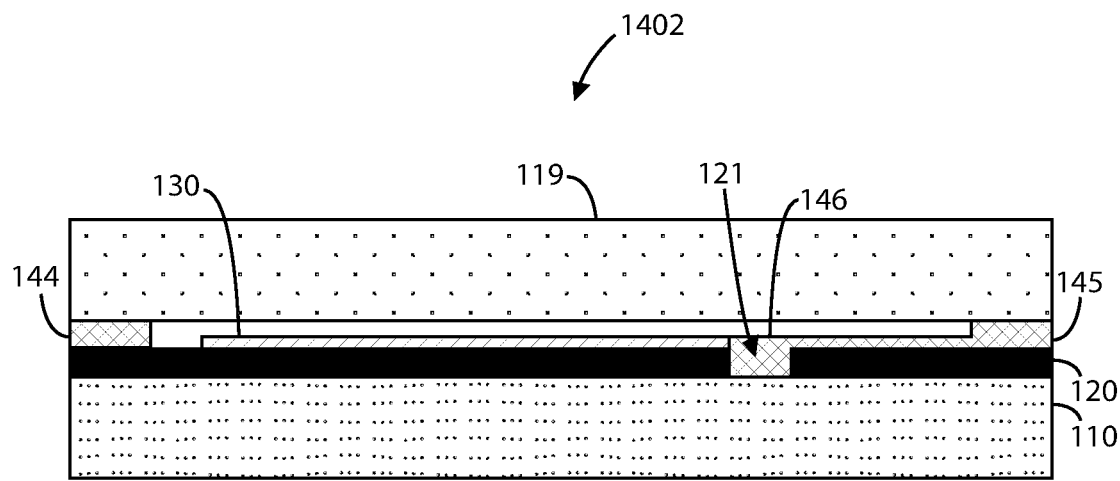
Figure 14C:
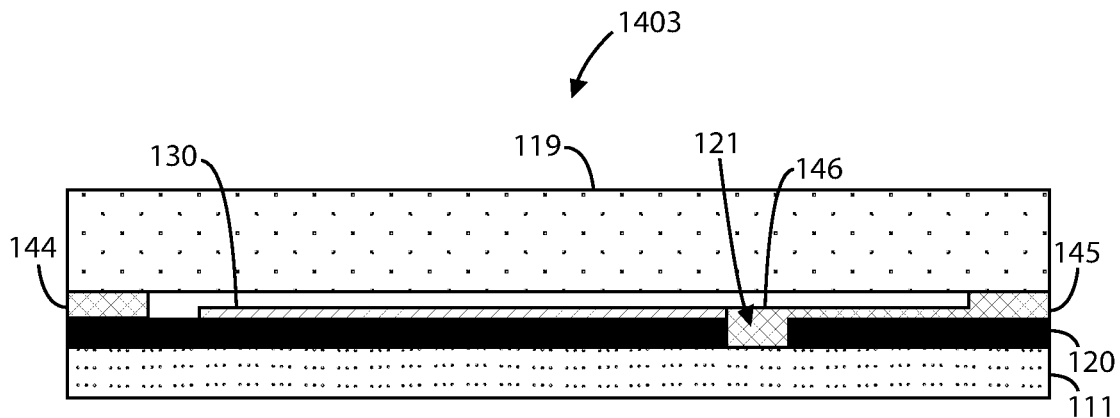
Figure 14D:
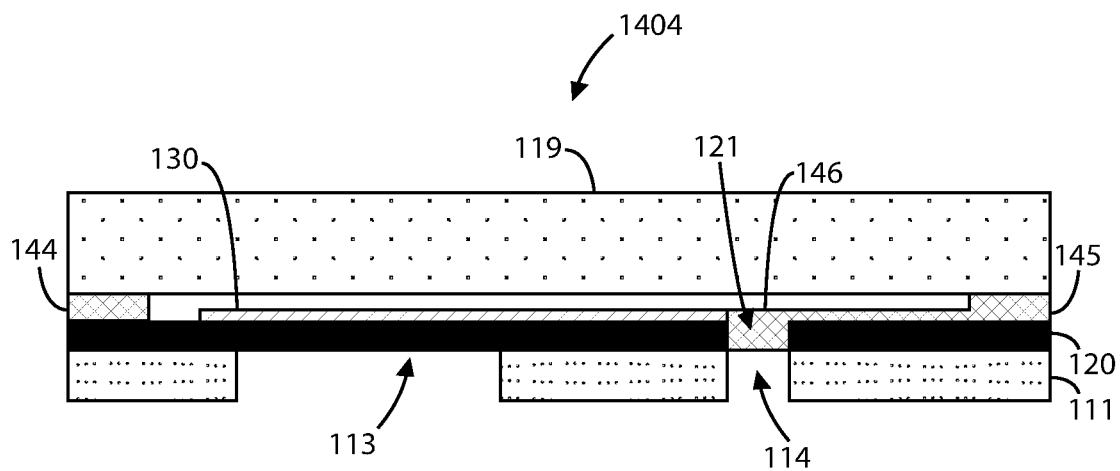
Figure 14E:
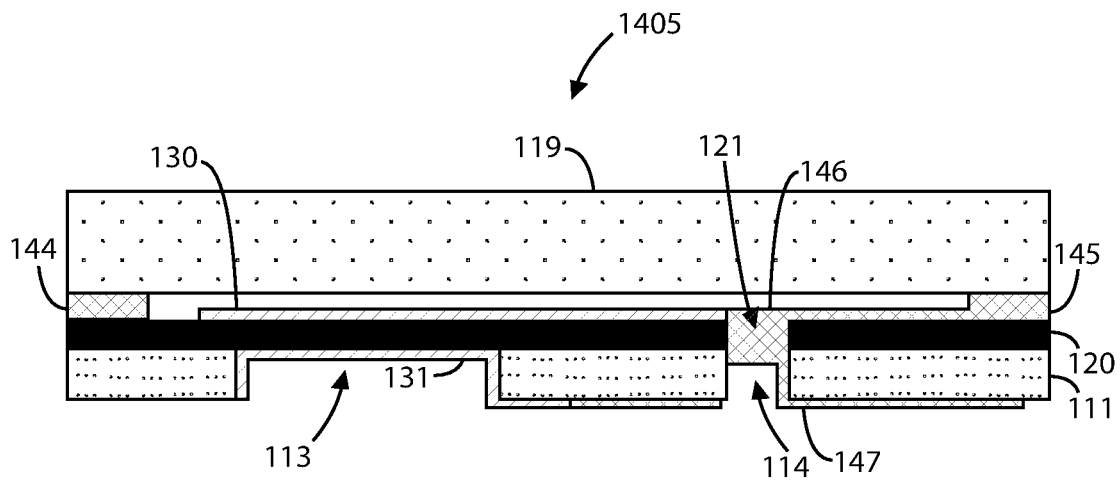
Figure 14F:
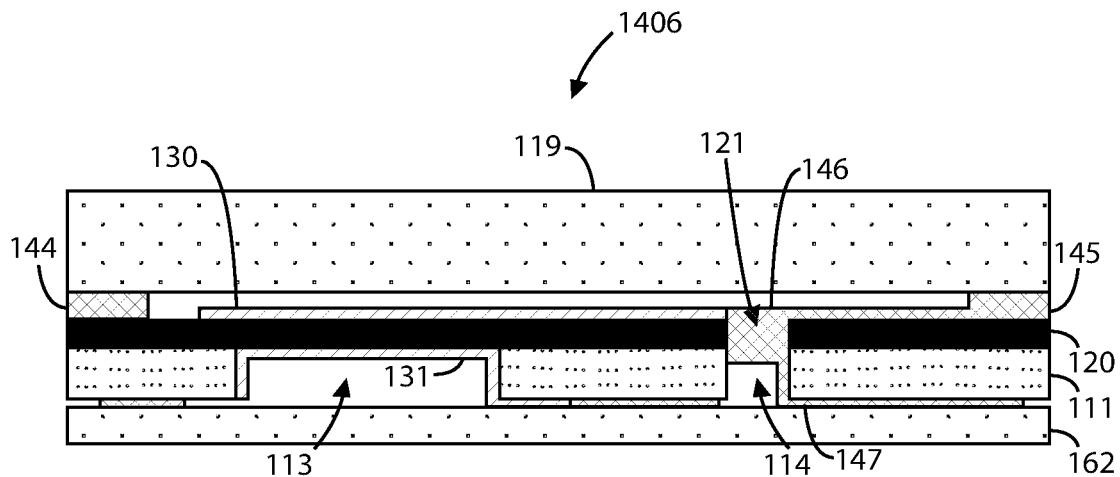

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the transfer substrate 110, which forms a transfer substrate 111, similar to that described in FIG. 8. FIG. 14D can represent a method step of forming first and second backside cavities, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
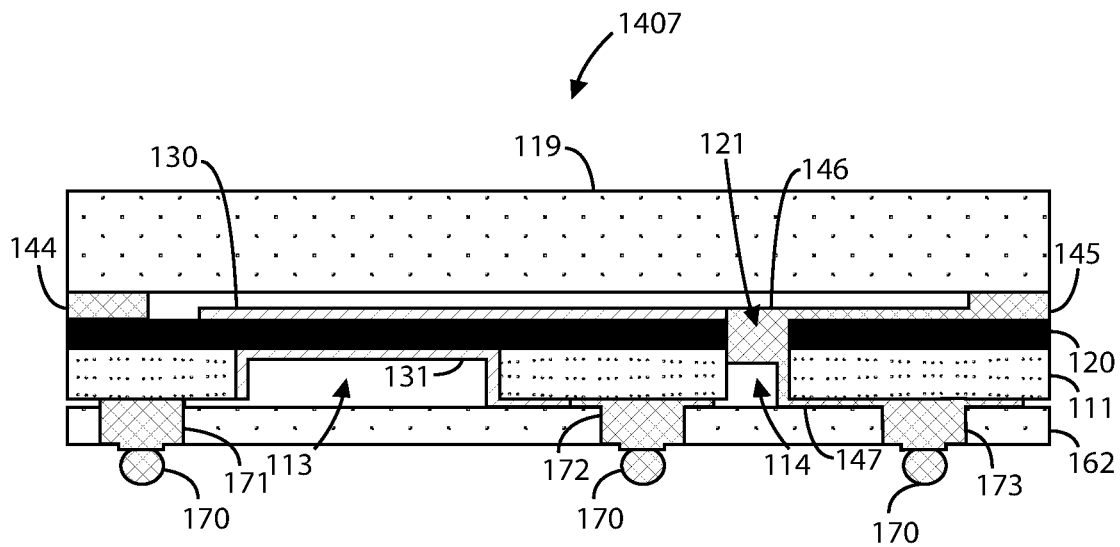

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
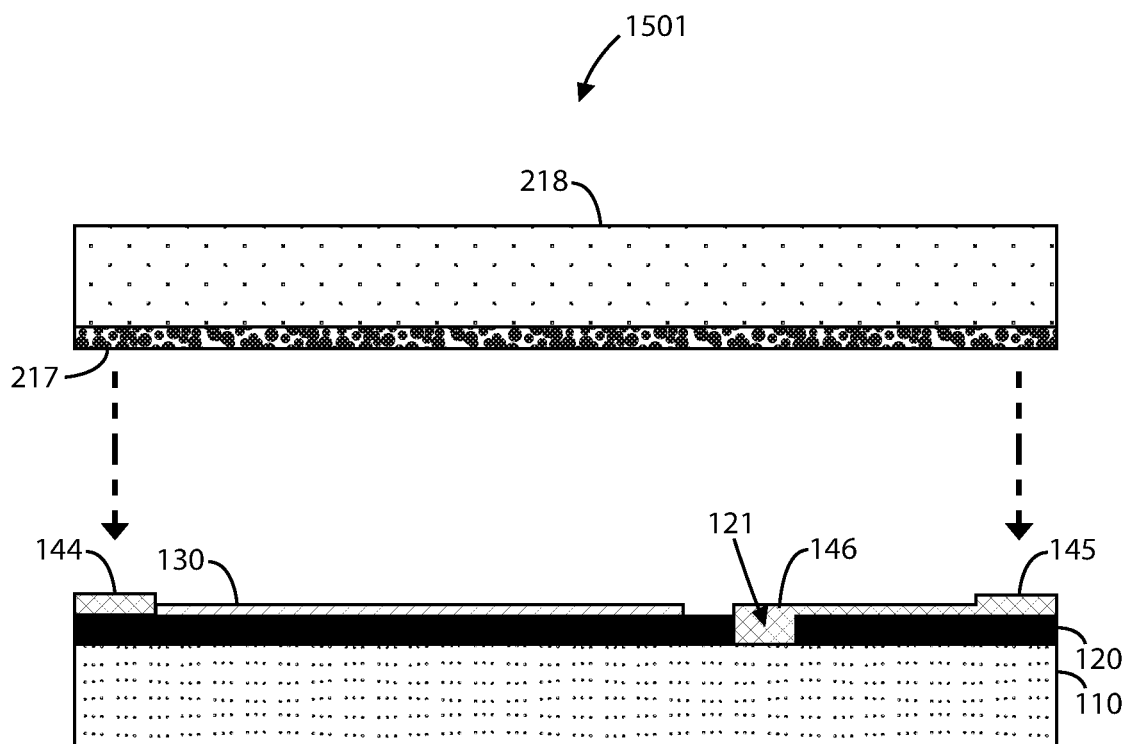
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
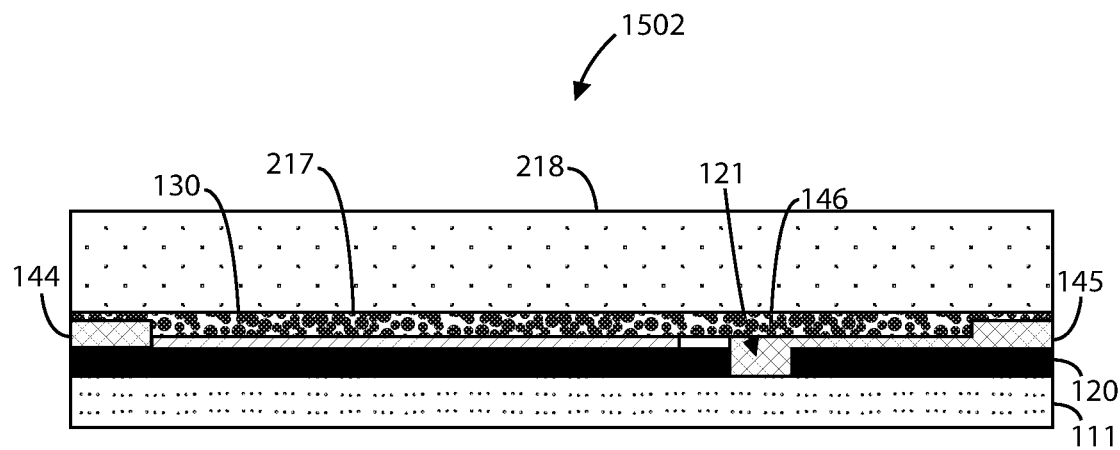

FIGS. 15B to 15F depict method steps similar to those described in the first process flow. FIG. 15B can represent a method step of thinning the transfer substrate 110, which forms a thinned substrate 111, similar to that described in FIG. 8. In a specific example, the thinning of the transfer substrate 110 can include a back side grinding process followed by a stress removal process. The stress removal process can include a dry etch, a Chemical Mechanical Planarization (CMP), and annealing processes.

Figure 15C:
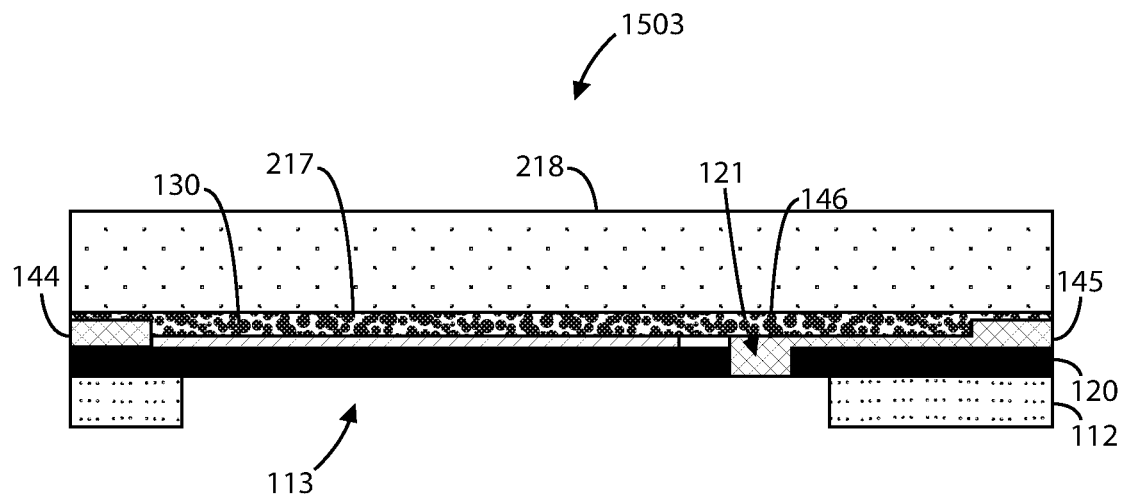

FIG. 15C can represent a method step of forming a shared backside cavity 113, similar to the techniques described in FIG. 9A. The main difference is that the shared backside cavity is configured underlying both topside metal electrode 130, topside micro-trench 121, and topside metal plug 146. In an example, the shared backside cavity 113 is a backside resonator cavity that can vary in size, shape (all possible geometric shapes), and side wall profile (tapered convex, tapered concave, or right angle). In a specific example, the forming of the shared backside cavity 113 can include a litho-etch process, which can include a back-to-front alignment and dry etch of the backside substrate 111. The piezoelectric layer 120 can serve as an etch stop layer for the forming of the shared backside cavity 113.

Figure 15D:
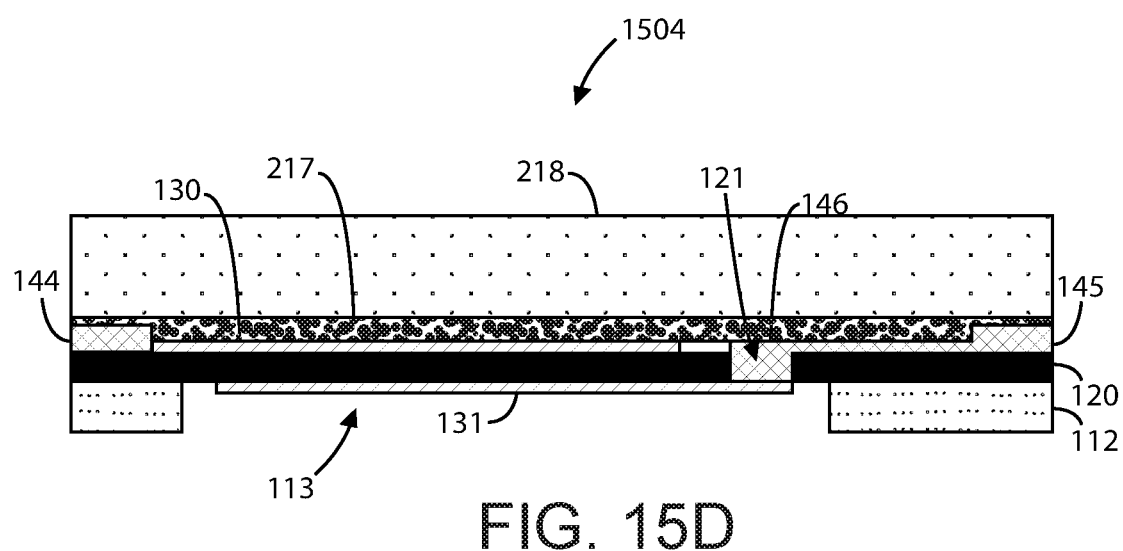

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside cavity 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside cavity such that the backside metal electrode does not come in contact with one or more side-walls of the transfer substrate created during the forming of the shared backside cavity.

Figure 15E:
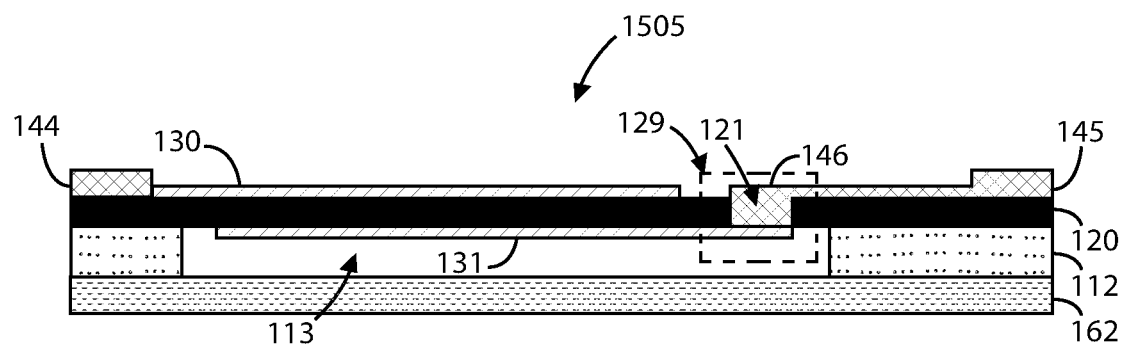

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

According to an example, the present invention includes a method for forming a piezoelectric layer to fabricate an acoustic resonator device. More specifically, the present method includes forming a single crystal material to be used to fabricate the acoustic resonator device. By modifying the strain state of the III-Nitride (III-N) crystal lattice, the present method can change the piezoelectric properties of the single crystal material to adjust the acoustic properties of subsequent devices fabricated from this material. In a specific example, the method for forming the strained single crystal material can include modification of growth conditions of individual layers by employing one or a combination of the following parameters; gas phase reactant ratios, growth pressure, growth temperature, and introduction of impurities.

In an example, the single crystal material is grown epitaxially upon a substrate. Methods for growing the single crystal material can include metal-organic chemical vapor deposition (MOCVD), molecular beam epitaxy (MBE), hydride vapor phase epitaxy (HVPE), atomic layer deposition (ALD), or the like. Various process conditions can be selectively varied to change the piezoelectric properties of the single crystal material. These process conditions can include temperature, pressure, layer thickness, gas phase ratios, and the like. For example, the temperature conditions for films containing aluminum (Al) and gallium (Ga) and their alloys can range from about 800 to about 1500 degrees Celsius. The temperature conditions for films containing Al, Ga, and indium (In) and their alloys can range from about 600 to about 1000 degrees Celsius. In another example, the pressure conditions for films containing Al, Ga, and In and their alloys can range from about 1E-4 Torr to about 900 Torr.

Figure 16:
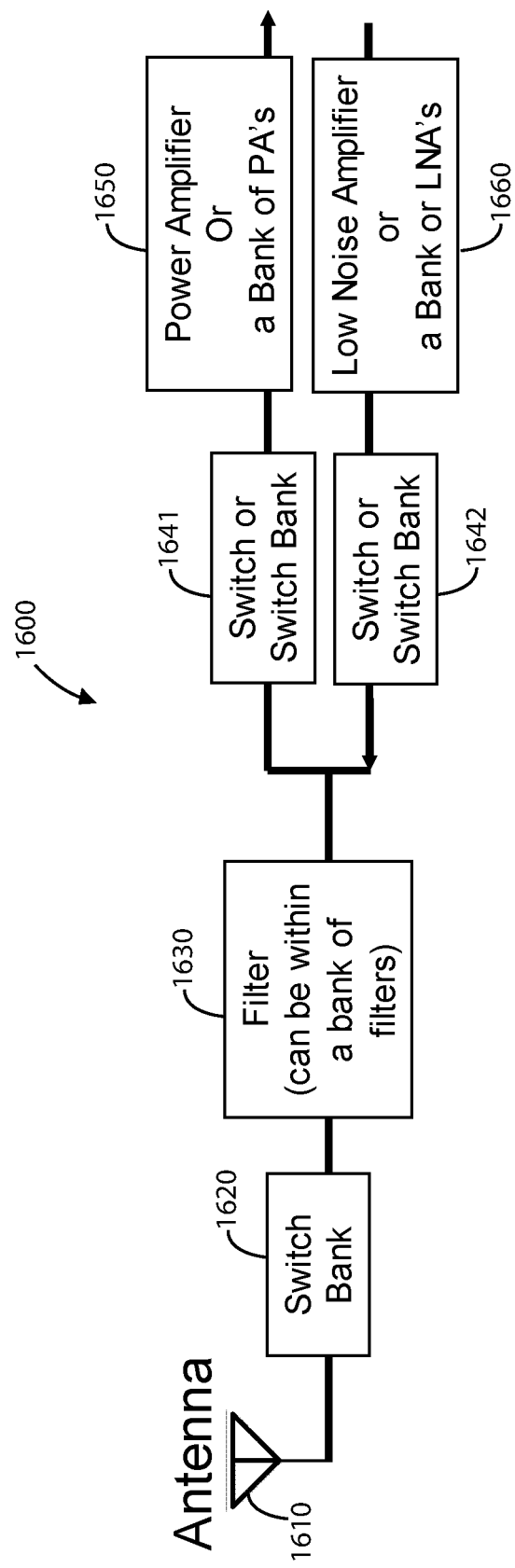
FIG. 16 is a simplified block diagram illustrating a communications system using an one or more communication filter devices according to an example of the present invention.

FIG. 16 is a simplified block diagram illustrating a communications system using an one or more communication filter devices according to an example of the present invention. As shown, communications system 1600 includes an antenna 1610 connected is series to a switch bank 1620 and filter (or bank of filters) 1630. This filter 1630 is connected to a pair of switches (or switch banks) 1641, 1642. The first switch 1641 is connected to a power amplifier (or bank of PA's) 1650, while the second switch 1642 is connected to a low noise amplifier (or bank or LNA's) 1660. This system 1600 is configured for both transmit and receive paths.

In a communications system, filters are required in both the transmit and receive paths. However, these paths can be implemented separately or together, i.e., a transceiver chip. Depending on the complexity of the system architecture, switches or banks of switches can be used to control the signal flow through different paths both in and out. Generally, any of the filters 1630 that is electrically connected to the antenna 1610 and a PA 1650 is configured for the transmit side, while any of the filters 1630 that is electrically connected to the antenna 1610 and an LNA 1660 is configured for the receive side. The number of filters and switches can vary depending on the number of bands supported and other tradeoffs. Those of ordinary skill in the art will recognize other variations, modifications, and alternatives.

In an example, the duplexers and filters module 1620 can include one or more single crystal acoustic resonators devices. Each of these device can include a piezoelectric substrate with a piezoelectric layer formed overlying a transfer substrate. A topside metal electrode is formed overlying the substrate. A topside micro-trench is formed within the piezoelectric layer. A topside metal with a topside metal plug is formed within the topside micro-trench. First and second backside cavities are formed within the transfer substrate under the topside metal electrode. A backside metal electrode is formed under the transfer substrate, within the first backside cavity, and under the topside metal electrode. A backside metal plug is formed under the transfer substrate, within the second backside cavity, and under the topside micro-trench. The backside metal plug is connected to the topside metal plug and the backside metal electrode. The topside micro-trench, the topside metal plug, the second backside cavity, and the backside metal plug form a microvia.

In a specific example, the communication filter can be a bandpass RF filter characterized by the following: 50Ω input/output, no external matching requirement, low insertion loss, high interference rejection, −20° C. to +85° C. operation, +31 dBm absolute max input power, 2.0×1.6 mm footprint, 0.90 mm max height, RoHS 6 compliant, halogen free, and Tetrabromobisphenal A (TBBPA) free. This filter can be used in smartphones, tablets, Internet of things (IoT), and other mobile or portable communication devices. Those of ordinary skill in the art will recognize other variations, modifications, and alternatives.

The following table provides the electrical specifications for a communication filter according to an example of the present invention:

SPECIFICATIONS
Electrical Specifications[1], $Z_0$ = 50 Ω, $T_C$[2] −20° C. to +85° C., unless otherwise specified

| Symbol | Parameter | Units | Min. | Typ.[3] | Max. |
|---|---|---|---|---|---|
| S21 | Insertion Loss, Band 41 | dB | | | |
| | 2496-2500 MHz (+25° C.) | | | 2.8 | |
| | 2496-2500 MHz (−20° C. to −5° C.) | | | | 3.9 |
| | 2496-2500 MHz (−5° C. to +85° C.) | | | | 3.7 |
| | 2500-2520 MHz (+25° C.) | | | 2.4 | 3.3 |
| | 2500-2520 MHz (−20° C. to +85° C.) | | | | 3.8 |
| | 2520-2680 MHz (+25° C.) | | | 2.0 | 3.0 |
| | 2520-2680 MHz (−20° C. to +85° C.) | | | | 3.2 |
| | 2680-2690 MHz (+25° C.) | | | 2.2 | 3.6 |
| | 2680-2690 MHz (−20° C. to +85° C.) | | | | 3.8 |
| S21 | Attenuation, 0-699 MHz | dB | 35 | 76 | |
| S21 | Attenuation, 699-916 MHz | dB | 35 | 56 | |
| S21 | Attenuation, 916-1348 MHz | dB | 25 | 47 | |
| S21 | Attenuation, 1248-1565 MHz | dB | 25 | 35 | |

-continued

SPECIFICATIONS
Electrical Specifications[1], $Z_0$ = 50 Ω, $T_C$[2] −20° C.
to +85° C., unless otherwise specified

| Symbol | Parameter | Units | Min. | Typ.[3] | Max. |
|---|---|---|---|---|---|
| S21 | Attenuation, 1565-1615 MHz | dB | 30 | 40 | |
| S21 | Attenuation, 1615-1660 MHz | dB | 25 | 34 | |
| S21 | Attenuation, 1660-1750 MHz | dB | 18 | 27 | |
| S21 | Attenuation, 1750-2400 MHz | dB | 12 | 22 | |
| S21 | Attenuation, Wi-Fi 802.11 b/g/n Band[4] | dB | | | |
| | 2401-2453 MHz (Wi-Fi Ch 1-7) | | | 35 | 45 |
| | 2436-2468 MHz (Wi-Fi Ch 8-10) | | | 35 | 44 |
| | 2451-2473 MHz (Wi-Fi Ch 11) | | | 30 | 44 |
| | 2456-2478 MHz (Wi-Fi Ch 12) | | | — | 30 |
| | 2461-2483 MHz (Wi-Fi Ch 13) | | | — | 18 |
| S21 | Attenuation, 2750-2850 MHz | dB | 20 | 37 | |
| S21 | Attenuation, 2850-3000 MHz | dB | 18 | 28 | |
| S21 | Attenuation, 3000-4992 MHz | dB | 20 | 27 | |
| S21 | Attenuation, 4992-5380 MHz | dB | 24 | 32 | |
| S21 | Attenuation, 5380-7488 MHz | dB | 20 | 32 | |
| S21 | Attenuation, 7488-8070 MHz | dB | 20 | 30 | |
| S11, S22 | Return Loss (SWR), 2496-2690 MHz | dB | 8 | 16 (1.4) | (2.3) |

Notes:
[1]Min./Max. specifications are guaranteed at the indicated temperature, unless otherwise noted.
[2]$T_C$ is the case temperature and is defined as the temperature of the underside of the filter where it makes contact with the circuit board.
[3]Typical data is the average value (arithmetic mean) of the parameter over the indicated band at +25° C.
[4]Wi-Fi Channel Average Attenuation, which is obtained by averaging [S21] over the center 19 MHz of the channels and converting to dB value.

The following table provides the absolute maximum ratings for a communication filter according to an example of the present invention:

ABSOLUTE MAXIMUM RATINGS[1]

| Parameter | Unit | Value |
|---|---|---|
| Storage temperature | ° C. | −40 to +125 |
| Maximum RF Input Power to Pin 1 (Tx)[2] | dBm | +31 |
| Maximum DC Voltage, any Pin to Gnd or between Pins[3] | $V_{DC}$ | 0 |

Notes:
[1]Operation in excess of any one of these conditions may result in permanent damage to the device.
[2]The ACPF-7141 is not symmetrical. Pin 1 is designed for higher power handling and is intended to be connected to the Tx blocks with Pin 2 connected to the system antenna.
[3]Internal DC resistance of any port to ground or between ports is approximately a short circuit.

The following table provides the maximum recommended operating conditions for a communication filter according to an example of the present invention:

MAXIMUM RECOMMENDED OPERATING CONDITIONS[4]

| Parameter | Unit | Value |
|---|---|---|
| Operating temperature, $T_C$[5] | ° C. | −30 to +85 |

Notes:
[4]The device will function over the recommended range without degradation in reliability or permanent change in performance, but is not guaranteed to meet electrical specifications.
[5]$T_C$ is defined as case temperature, the temperature of the underside of the filter where it makes contact with the circuit board.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic filter or resonator using multiple ways of three-dimensional stacking through a wafer level process. Such single crystal acoustic resonators enable high bandwidth-low loss filters in a miniature form factor, and such filters or resonators can be implemented in an RF filter device, an RF filter system, or the like. In an example, this communication filter can be a miniature filter configured for use in a 2496-2690 MHz wireless frequency spectrum. This filter can operate concurrently with adjacent 2.4 GHz bands including Wi-Fi, WLAN, Bluetooth, ISM, and the like. Depending upon the embodiment, one or more of these benefits may be achieved.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as an aluminum, gallium, or ternary compound of aluminum and gallium and nitrogen containing epitaxial region, or functional regions, combinations, and the like. Therefore, the above description and illustrations should not be taken as limiting the scope of the present invention which is defined by the appended claims.

What is claimed is:
1. A communication filter device comprising:
   a piezoelectric substrate having a substrate surface region, the piezoelectric substrate having a piezoelectric layer formed overlying a transfer substrate;
   a topside metal electrode formed overlying a portion of the substrate surface region;
   a topside micro-trench formed within a portion of the piezoelectric layer;
   one or more bond pads formed overlying one or more portions of the piezoelectric layer;
   a topside metal having a topside metal plug formed within the topside micro-trench and electrically coupled to at least one of the bond pads;

a first backside cavity formed adjacent to the transfer substrate and underlying the topside metal electrode;
a second backside cavity formed within the transfer substrate and underlying the topside micro-trench;
a backside metal electrode formed underlying one or more portions of the transfer substrate, within the first backside cavity, and underlying the topside metal electrode;
a backside metal plug formed underlying one or more portions of the transfer substrate, within the second backside cavity, and underlying the topside micro-trench, the backside metal plug being electrically coupled to the topside metal plug and the backside metal electrode, wherein the topside micro-trench, the topside metal plug, the second backside cavity, and the backside metal plug form a micro-via;
a top cap structure bonded to the piezoelectric substrate, the top cap structure including one or more thru via structures electrically coupled to one or more top bond pads and one or more bottom bond pads;
wherein the one or more bottom bond pads are electrically coupled to the one or more bond pads and the topside metal;
a backside cap structure bonded to the transfer substrate, the backside cap structure underlying the first and second backside cavities; and
one or more solder balls formed overlying the one or more top bond pads;
wherein the top cap structure includes a silicon substrate and wherein the one or more thru via structures comprise thru silicon via structures electrically coupled to the one or more top bond pads and the one or more bottom bond pads.

2. The device of claim 1 wherein the transfer substrate includes silicon, silicon carbide, aluminum oxide, silicon-on-insulation (SOI), or single crystal aluminum gallium nitride materials.

3. The device of claim 1 wherein the topside and backside metal electrodes include molybdenum, aluminum, ruthenium, or titanium materials, or combinations thereof; and wherein the topside metal, the topside metal plug, and the backside metal plug includes gold, aluminum, copper, or other interconnect materials.

4. A communication filter device comprising:
a piezoelectric substrate having a substrate surface region, the piezoelectric substrate having a piezoelectric layer formed overlying a transfer substrate;
a topside metal electrode formed overlying a portion of the substrate surface region;
a topside micro-trench formed within a portion of the piezoelectric layer;
one or more bond pads formed overlying one or more portions of the piezoelectric layer;
a topside metal having a topside metal plug formed within the topside micro-trench and electrically coupled to at least one of the bond pads;
a first backside cavity formed adjacent to the transfer substrate and underlying the topside metal electrode;
a second backside cavity formed within the transfer substrate and underlying the topside micro-trench;
a backside metal electrode formed underlying one or more portions of the transfer substrate, within the first backside cavity, and underlying the topside metal electrode;
a backside metal plug formed underlying one or more portions of the transfer substrate, within the second backside cavity, and underlying the topside micro-trench, the backside metal plug being electrically coupled to the topside metal plug and the backside metal electrode, wherein the topside micro-trench, the topside metal plug, the second backside cavity, and the backside metal plug form a micro-via;
a top cap structure bonded to the piezoelectric substrate, the top cap structure including one or more thru via structures electrically coupled to one or more top bond pads and one or more bottom bond pads;
wherein the one or more bottom bond pads are electrically coupled to the one or more bond pads and the topside metal;
a backside cap structure bonded to the transfer substrate, the backside cap structure underlying the first and second backside cavities; and
one or more solder balls formed overlying the one or more top bond pads;
wherein the top cap structure includes a metallized laminate substrate wherein the one or more thru via structures comprise one or more thru substrate via (TSV) structures electrically coupled to the one or more top bond pads and the one or more bottom pads.

5. The device of claim 4 wherein the backside cap structure includes a transfer substrate, a glass substrate, a silicon substrate, a sapphire ($Al_2O_3$) substrate, or an interposer substrate.

6. The device of claim 4 wherein the first backside cavity has a trench shape similar to a shape of the topside metal electrode; or
wherein the first backside cavity has a trench shape similar to a shape of the backside metal electrode.

7. The device of claim 4 wherein the first backside cavity has a cavity shape different from both a shape of the topside metal electrode and the backside metal electrode.

8. A communication filter device comprising:
a piezoelectric substrate having a substrate surface region, the piezoelectric substrate having a piezoelectric layer formed overlying a transfer substrate, wherein the piezoelectric layer is bonded to the transfer substrate using one or more dielectric layers containing silicon nitride, silicon oxide, or other adhesion materials;
a topside metal electrode formed overlying a portion of the substrate surface region;
a topside micro-trench formed within a portion of the piezoelectric layer;
one or more bond pads more portions of the piezoelectric layer;
a topside metal having a topside metal plug formed within the topside micro-trench and electrically coupled to at least one of the bond pads;
a first backside cavity formed adjacent to the transfer substrate and underlying the topside metal electrode;
a second backside cavity formed within the transfer substrate and underlying the topside micro-trench;
a backside metal electrode formed underlying one or more portions of the transfer substrate, within the first backside cavity, and underlying the topside metal electrode; and
a backside metal plug formed underlying one or more portions of the transfer substrate, within the second backside cavity, and underlying the topside micro-trench, the backside metal plug being electrically coupled to the topside metal plug and the backside metal electrode, wherein the topside micro-trench, the topside metal plug, the second backside cavity, and the backside metal plug form a micro-via.

9. A communication filter device comprising:
a piezoelectric substrate having a substrate surface region, the piezoelectric substrate having a piezoelectric layer formed overlying a transfer substrate, wherein the piezoelectric layer is bonded to the transfer substrate using one or more dielectric layers containing silicon nitride, silicon oxide, or other adhesion materials;

a topside metal electrode formed overlying a portion of the substrate surface region;

a topside micro-trench formed within a portion of the piezoelectric layer;

one or more bond pads formed overlying one or more portions of the piezoelectric layer;

a topside metal having a topside metal plug formed within the topside micro-trench and electrically coupled to at least one of the bond pads;

a thinned top cap structure bonded to the piezoelectric substrate, the thinned top cap structure including one or more blind via structures electrically coupled to one or more bottom bond pads, wherein the one or more blind via structures are exposed;

wherein the one or more bottom bond pads are electrically coupled to the one or more bond pads and the topside metal;

a first backside cavity formed within the transfer substrate and underlying the topside metal electrode;

a second backside cavity formed within the transfer substrate and underlying the topside micro-trench;

a backside metal electrode formed underlying one or more portions of the transfer substrate, within the first backside cavity, and underlying the topside metal electrode;

a backside metal plug formed underlying one or more portions of the transfer substrate, within the second backside cavity, and underlying the topside micro-trench, the backside metal plug being electrically coupled to the topside metal plug and the backside metal electrode, wherein the topside micro-trench, the topside metal plug, the second backside cavity, and the backside metal plug form a micro-via;

a backside cap structure bonded to the transfer substrate, the backside cap structure underlying the first and second backside cavities;

one or more top bond pads formed overlying and electrically coupled to the one or more blind vias; and one or more solder balls formed overlying the one or more top bond pads.

10. The device of claim 9 wherein the transfer substrate includes silicon, silicon carbide, aluminum oxide, silicon-on-insulator (SOI), or single crystal aluminum gallium nitride materials.

11. The device of claim 9 wherein the topside and backside metal electrodes include molybdenum, aluminum, ruthenium, or titanium materials, or combinations thereof; and wherein the topside metal, the topside metal plug, and the backside metal plug include gold, aluminum, copper, or other interconnect materials.

12. The device of claim 9 wherein the backside cap structure includes a transfer substrate, a glass substrate, a silicon substrate, a sapphire ($Al_2O_3$) substrate, or an interposer substrate.

13. The device of claim 9 wherein the top cap structure includes an interposer substrate and wherein the one or more blind via structures comprise one or more blind metal via structures electrically coupled to the one or more bottom bond pads.

14. A communication filter device comprising:

a piezoelectric substrate having a substrate surface region, the piezoelectric substrate having a piezoelectric layer formed overlying a transfer substrate;

a topside metal electrode formed overlying a portion of the substrate surface region;

a topside micro-trench formed within a portion of the piezoelectric layer;

one or more bond pads formed overlying one or more portions of the piezoelectric layer;

a topside metal having a topside metal plug formed within the topside micro-trench and electrically coupled to at least one of the bond pads;

a thinned top cap structure bonded to the piezoelectric substrate, the thinned top cap structure including one or more blind via structures electrically coupled to one or more bottom bond pads, wherein the one or more blind via structures are exposed;

wherein the one or more bottom bond pads are electrically coupled to the one or more bond pads and the topside metal;

a first backside cavity formed within the transfer substrate and underlying the topside metal electrode;

a second backside cavity formed within the transfer substrate and underlying the topside micro-trench;

a backside metal electrode formed underlying one or more portions of the transfer substrate, within the first backside cavity, and underlying the topside metal electrode;

a backside metal plug formed underlying one or more portions of the transfer substrate, within the second backside cavity, and underlying the topside micro-trench, the backside metal plug being electrically coupled to the topside metal plug and the backside metal electrode, wherein the topside micro-trench, the topside metal plug, the second backside cavity, and the backside metal plug form a micro-via;

a backside cap structure bonded to the transfer substrate, the backside cap structure underlying the first and second backside cavities;

one or more top bond pads formed overlying and electrically coupled to the one or more blind vias; and one or more solder balls formed overlying the one or more top bond pads;

wherein the top cap structure includes a silicon substrate and wherein the one or more blind via structures comprise blind silicon via structures electrically coupled to the one or more bottom bond pads.

15. A communication filter device comprising:

a piezoelectric substrate having a substrate surface region, the piezoelectric substrate having a piezoelectric layer formed overlying a transfer substrate;

a topside metal electrode formed overlying a portion of the substrate surface region;

a topside micro-trench formed within a portion of the piezoelectric layer;

one or more bond pads formed overlying one or more portions of the piezoelectric layer;

a topside metal having a topside metal plug formed within the topside micro-trench and electrically coupled to at least one of the bond pads;

a thinned top cap structure bonded to the piezoelectric substrate, the thinned top cap structure including one or more blind via structures electrically coupled to one or more bottom bond pads, wherein the one or more blind via structures are exposed;

wherein the one or more bottom bond pads are electrically coupled to the one or more bond pads and the topside metal;

a first backside cavity formed within the transfer substrate and underlying the topside metal electrode;

a second backside cavity formed within the transfer substrate and underlying the topside micro-trench;

a backside metal electrode formed underlying one or more portions of the transfer substrate, within the first backside cavity, and underlying the topside metal electrode;

a backside metal plug formed underlying one or more portions of the transfer substrate, within the second backside cavity, and underlying the topside micro-trench, the backside metal plug being electrically coupled to the topside metal plug and the backside metal electrode, wherein the topside micro-trench, the topside metal plug, the second backside cavity, and the backside metal plug form a micro-via;

a backside cap structure bonded to the transfer substrate, the backside cap structure underlying the first and second backside cavities;

one or more top bond pads formed overlying and electrically coupled to the one or more blind vias; and one or more solder balls formed overlying the one or more top bond pads;

wherein the top cap structure includes a metallized laminate substrate wherein the one or more blind via structures comprise one or more blind substrate via structures electrically coupled to the one or more bottom pads.

16. A communication filter device comprising:
a piezoelectric substrate having a substrate surface region, the piezoelectric substrate having a piezoelectric layer formed overlying a transfer substrate, wherein the piezoelectric layer is bonded to the transfer substrate using one or more dielectric layers containing silicon nitride, silicon oxide, or other adhesion materials;
a topside metal electrode formed overlying a portion of the substrate surface region;
a topside micro-trench formed within a portion of the piezoelectric layer;
one or more bond pads formed overlying one or more portions of the piezoelectric layer;
a topside metal having a topside metal plug formed within the topside micro-trench and electrically coupled to at least one of the bond pads;
a top cap structure bonded to the piezoelectric substrate, the top cap structure including a substrate with one or more bottom bond pads;
wherein the one or more bottom bond pads are electrically coupled to the one or more bond pads and the topside metal;
a first backside cavity formed within the transfer substrate and underlying the topside metal electrode;
a second backside cavity formed within the transfer substrate and underlying the topside micro-trench;
a backside metal electrode formed underlying one or more portions of the transfer substrate, within the first backside cavity, and underlying the topside metal electrode;
a backside metal plug formed underlying one or more portions of the transfer substrate, within the second backside cavity, and underlying the topside microtrench, the bottom topside metal plug being electrically coupled to the topside metal plug, wherein the topside micro-trench, the topside metal plug, the second backside cavity, and the backside metal plug form a microvia;
a backside cap structure bonded to the transfer substrate, the backside cap structure underlying the first and second backside cavity;
one or more backside bond pads formed within one or more portions of the backside cap structure, the one or more of the backside bond pads being electrically coupled to the backside metal plug; and
one or more solder balls formed underlying the one or more backside bond pads.

17. The device of claim 16 wherein the transfer substrate includes silicon, silicon carbide, aluminum oxide, silicon-on-insulation (SOI), or single crystal aluminum gallium nitride materials.

18. The device of claim 16 wherein the topside and backside metal electrodes include molybdenum, aluminum, ruthenium, or titanium materials, or combinations thereof; and wherein the topside metal, the topside metal plug, and the backside metal plug include gold, aluminum, copper, or other interconnect materials.

19. The device of claim 16 wherein the backside cap structure includes a silicon substrate, a glass substrate, a silicon substrate, a sapphire ($Al_2O_3$) substrate, or a smart-glass substrate.

20. A communication filter device comprising:
a piezoelectric substrate having a substrate surface region, the piezo electric substrate having a piezoelectric layer formed overlying a transfer substrate, wherein the piezoelectric layer is bonded to the transfer substrate using one or more dielectric layers containing silicon nitride, silicon oxide, or other adhesion materials;
a topside metal electrode formed overlying a portion of the substrate surface region;
a topside micro-trench formed within a portion of the piezoelectric layer;
one or more bond pads formed overlying one or more portions of the piezoelectric layer;
a topside metal having a topside metal plug formed within the topside micro-trench and electrically coupled to at least one of the bond pads;
a shared backside cavity formed within the transfer substrate and underlying the topside metal electrode and the topside micro-trench;
a backside metal electrode formed underlying one or more portions of the transfer substrate, within the shared backside cavity, and underlying the topside metal electrode; and
a backside metal formed underlying one or more portions of the transfer substrate, within the shared backside cavity, and underlying the topside micro-trench, the backside metal being electrically coupled to the topside metal plug and the backside metal electrode, wherein the topside micro-trench, the topside metal plug, and the backside metal form a micro-via.

21. The device of claim 20 wherein the transfer substrate includes silicon, silicon carbide, aluminum oxide, silicon-on-insulation (SOI), or single crystal aluminum gallium nitride materials.

22. The device of claim 20 wherein the topside and backside metal electrodes include molybdenum, aluminum, ruthenium, or titanium materials, or combinations thereof; and wherein the topside metal, the topside metal plug, and the backside metal includes gold, aluminum, copper, or other interconnect materials.

23. The device of claim 20 further comprising a backside cap structure bonded to the transfer substrate, the backside cap structure underlying the shared backside cavity, wherein the backside cap structure includes a transfer substrate, a glass substrate, or an interposer substrate.

24. The device of claim 20 wherein the backside metal electrode is patterned within the boundaries of the shared backside cavity such that the backside metal electrode does not come in contact with one or more side-walls of the transfer substrate created during the forming of the shared backside cavity.

* * * * *